United States Patent
Bourassa et al.

(10) Patent No.: US 12,372,850 B2
(45) Date of Patent: Jul. 29, 2025

(54) ELECTRICALLY TUNABLE QUANTUM INFORMATION PROCESSING DEVICE BASED ON A DOPED SEMICONDUCTOR STRUCTURE EMBEDDED WITH A DEFECT

(71) Applicant: The University of Chicago, Chicago, IL (US)

(72) Inventors: Alexandre Bourassa, Chicago, IL (US); Christopher P. Anderson, Chicago, IL (US); David D. Awschalom, Chicago, IL (US)

(73) Assignee: The University of Chicago, Chicago, IL (US)

( * ) Notice: Subject to any disclaimer, the term of this patent is extended or adjusted under 35 U.S.C. 154(b) by 836 days.

(21) Appl. No.: 17/438,600

(22) PCT Filed: Mar. 13, 2020

(86) PCT No.: PCT/US2020/022702
§ 371 (c)(1),
(2) Date: Sep. 13, 2021

(87) PCT Pub. No.: WO2020/190749
PCT Pub. Date: Sep. 24, 2020

(65) Prior Publication Data
US 2022/0179284 A1 Jun. 9, 2022

Related U.S. Application Data

(60) Provisional application No. 62/863,674, filed on Jun. 19, 2019, provisional application No. 62/819,221, filed on Mar. 15, 2019.

(51) Int. Cl.
*G02F 3/02* (2006.01)
*G06N 10/40* (2022.01)
(Continued)

(52) U.S. Cl.
CPC .............. *G02F 3/022* (2013.01); *G06N 10/40* (2022.01); *H10N 60/11* (2023.02); *H10N 60/84* (2023.02)

(58) Field of Classification Search
CPC ... G02F 3/00; G02F 3/02; G02F 3/022; G02F 2202/108; G06N 10/20; H01L 29/868; H01L 33/06; H10N 60/11
See application file for complete search history.

(56) References Cited

U.S. PATENT DOCUMENTS

| | | | |
|---|---|---|---|
| 6,728,281 B1 * | 4/2004 | Santori | B82Y 10/00 372/45.01 |
| 2004/0145735 A1 * | 7/2004 | Silberberg | G01N 21/65 356/301 |

(Continued)

OTHER PUBLICATIONS

C. Bonato, M. S. Blok, H. T. Dinani, D. W. Berry, M. L. Markham, D. J. Twitchen, R. Hanson, Optimized quantum sensing with a single electron spin using real-time adaptive measurements, Nat. Nanotechnol. 11, 247-252 (2016).

(Continued)

*Primary Examiner* — John A Bodnar
(74) *Attorney, Agent, or Firm* — Crowell & Moring LLP

(57) ABSTRACT

This disclosure relates to optical devices for quantum information processing applications. In one example implementation, a semiconductor structure is provided. The semiconductor structure may be embedded with single defects that can be individually addressed. An electric bias and/or one or more optical excitations may be configured to control the single defects in the semiconductor structure to produce single photons for use in quantum information processing. The electric bias and optical excitations are selected and adjusted to control various carrier processes and to reduce environmental charge instability of the single defects to achieve optical emission with wide wavelength tunability (Continued)

and narrow spectral linewidth. Electrically controlled single photon source and other electro-optical devices may be achieved.

16 Claims, 32 Drawing Sheets

(51) Int. Cl.
    *H01L 39/10*     (2006.01)
    *H01L 39/22*     (2006.01)
    *H10N 60/10*     (2023.01)
    *H10N 60/84*     (2023.01)

(56) References Cited

U.S. PATENT DOCUMENTS

2014/0291490 A1    10/2014    Hanson et al.
2017/0261835 A1    9/2017    Koehl et al.

OTHER PUBLICATIONS

G. Waldherr, Y. Wang, S. Zaiser, M. Jamali, T. Schulte-Herbrüggen, H. Abe, T. Ohshima, J. Isoya, J.F. Du, P. Neumann, J. Wrachtrup, Quantum error correction in a solid-state hybrid spin register, Nature. 506, 204-207 (2014).
D. D. Awschalom, R. Hanson, J. Wrachtrup, B. B. Zhou, Quantum technologies with optically interfaced solid-state spins, Nat. Photonics. 12, 516-527 (2018).
L. Robledo, L. Childress, H. Bernien, B. Hensen, P. F. A. Alkemade, R. Hanson, High-fidelity projective read-out of a solid-state spin quantum register, Nature. 477, 574-578 (2011).
K. D. Jöns, K. Stensson, M. Reindl, M. Swillo, Y. Huo, V. Zwiller, A. Rastelli, R. Trotta, G. Björk, Two-photon interference from two blinking quantum emitters, Phys. Rev. B. 96, 75430 (2017).
H. Bernien, B. Hensen, W. Pfaff, G. Koolstra, M. S. Blok, L. Robledo, T. H. Taminiau, M. Markham, D. J. Twitchen, L. Childress, R. Hanson, Heralded entanglement between solid-state qubits separated by three metres., Nature. 497, 86-90 (2013).
D. Bluvstein, Z. Zhang, A. C. B. Jayich, Identifying and mitigating charge instabilities in shallow diamond nitrogen-vacancy centers, Phys. Rev. Lett. 122, 76101 (2018).
B. Kambs, C. Becher, Limitations on the indistinguishability of photons from remote solid state sources, New J. Phys. 20, 115003 (2018).
L. C. Bassett, F. J. Heremans, C. G. Yale, B. B. Buckley, D. D. Awschalom, Electrical Tuning of Single Nitrogen-Vacancy Center Optical Transitions Enhanced by Photoinduced Fields, Phys. Rev. Lett. 107, 266403 (2011).
C. F. de las Casas, D. J. Christle, J. Ul Hassan, T. Ohshima, N. T. Son, D. D. Awschalom, Stark tuning and electrical charge state control of single divacancies in silicon carbide, Appl. Phys. Lett. 111, 262403 (2017).
W. Pfaff, B. J. Hensen, H. Bernien, S. B. van Dam, M. S. Blok, T. H. Taminiau, M. J. Tiggelman, R. N. Schouten, M. Markham, D. J. Twitchen, R. Hanson, Unconditional quantum teleportation between distant solid-state quantum bits, Science (80-. ). 345, 1-8 (2014).
V. M. Acosta, C. Santori, A. Faraon, Z. Huang, K.-M. C. Fu, A. Stacey, D. A. Simpson, K. Ganesan, S. Tomljenovic-Hanic, A. D. Greentree, S. Prawer, R. G. Beausoleil, Dynamic Stabilization of the Optical Resonances of Single Nitrogen-Vacancy Centers in Diamond, Phys. Rev. Lett. 108, 206401 (2012).
Y. Chu, N. P. de Leon, B. J. Shields, B. Hausmann, R. Evans, E. Togan, M. J. Burek, M. Markham, A. Stacey, a S. Zibrov, A. Yacoby, D. J. Twitchen, M. Loncar, H. Park, P. Maletinsky, M. D. Lukin, N. P. De Leon, B. J. Shields, B. Hausmann et al., Coherent optical transitions in implanted nitrogen vacancy centers., Nano Lett. 14, 1982-6 (2014).
J. Wolters, N. Sadzak, A. W. Schell, T. Schroder, O. Benson, Measurement of the Ultrafast Spectral Diffusion of the Optical Transition of Nitrogen Vacancy Centers in Nano-Size Diamond Using Correlation Interferometry, Phys. Rev. Lett. 110, 027401 (2013).
T. Murai, T. Makino, H. Kato, M. Shimizu, T. Murooka, E. D. Herbschleb, Y. Doi, H. Morishita, M. Fujiwara, M. Hatano, S. Yamasaki, N. Mizuochi, Engineering of Fermi level by nin diamond junction for control of charge states of NV centers, Appl. Phys. Lett. 112, 111903 (2018).
S. B. van Dam, M. Walsh, M. J. Degen, E. Bersin, S. L. Mouradian, A. Galiullin, M. Ruf, M. IJspeert, T. H. Taminiau, R. Hanson, D. R. Englund, Optical coherence of diamond nitrogen-vacancy centers formed by ion implantation and annealing, Phys. Rev. B. 99, 161203 (2018).
K. Beha, A. Batalov, N. B. Manson, R. Bratschitsch, A. Leitenstorfer, Optimum Photoluminescence Excitation and Recharging Cycle of Single Nitrogen-Vacancy Centers in Ultrapure Diamond, Phys. Rev. Lett. 109, 097404 (2012).
G. Wolfowicz, C. P. Anderson, A. L. Yeats, S. J. Whiteley, J. Niklas, O. G. Poluektov, F. J. Heremans, D. D. Awschalom, J. Nicklas, O. G. Poluektov, F. J. Heremans, D. D. Awschalom, Optical charge state control of spin defects in 4H—SiC, Nat. Commun. 8, 1876 (2017).
B. J. Shields, Q. P. Unterreithmeier, N. P. De Leon, H. Park, M. D. Lukin, N. P. De Leon, H. Park, M. D. Lukin, Efficient Readout of a Single Spin State in Diamond via Spin-to-Charge Conversion, Phys. Rev. Lett. 114, 1-5 (2015).
P. Siyushev, M. Nesladek, E. Bourgeois, M. Gulka, J. Hruby, T. Yamamoto, M. Trupke, T. Teraji, J. Isoya, F. Jelezko, Photoelectrical imaging and coherent spin-state readout of single nitrogen-vacancy centers in diamond, Science (80-. ). 363, 728-731 (2019).
W. F. Koehl, B. B. Buckley, F. J. Heremans, G. Calusine, D. D. Awschalom, Room temperature coherent control of defect spin qubits in silicon carbide., Nature. 479, 84-7 (2011).
D. J. Christle, A. L. Falk, P. Andrich, P. V. Klimov, J. U. Hassan, N. T. Son, E. Janzén, T. Ohshima, D. D. Awschalom, Isolated electron spins in silicon carbide with millisecond coherence times, Nat. Mater. 14, 160-163 (2015).
P. V. Klimov, A. L. Falk, D. J. Christle, V. V. Dobrovitski, D. D. Awschalom, Quantum entanglement at ambient conditions in a macroscopic solid-state spin ensemble, Sci. Adv. 1, e1501015 (2015).
D. J. Christle, P. V. Klimov, C. F. de las Casas, K. Szász, V. Ivády, V. Jokubavicius, J. Ul Hassan, M. Syväjärvi, W. F. Koehl, T. Ohshima, N. T. Son, E. Janzen, A. Gali, D. D. Awschalom, Isolated Spin Qubits in SiC with a High-Fidelity Infrared Spin-to-Photon Interface, Phys. Rev. X. 7, 021046 (2017).
M. Kim, H. J. Mamin, M. H. Sherwood, K. Ohno, D. D. Awschalom, D. Rugar, Decoherence of Near-Surface Nitrogen-Vacancy Centers Due to Electric Field Noise, Phys. Rev. Lett. 115, 087602 (2015).
M. S. Grinolds, M. Warner, K. De Greve, Y. Dovzhenko, L. Thiel, R. L. Walsworth, S. Hong, P. Maletinsky, A. Yacoby, Subnanometre resolution in three-dimensional magnetic resonance imaging of individual dark spins, Nat. Nanotechnol. 9, 279-284 (2014).
M. Pfender, N. Aslam, P. Simon, D. Antonov, G. Thiering, S. Burk, F. Fávaro de Oliveira, A. Denisenko, H. Fedder, J. Meijer, J. A. Garrido, A. Gali, T. Teraji, J. Isoya, M. W. Doherty, A. Alkauskas, A. Gallo, A. Grüneis, P. Neumann et al., Protecting a Diamond Quantum Memory by Charge State Control, Nano Lett. 17, 5931-5937 (2017).
M. Widmann, M. Niethammer, T. Makino, T. Rendler, S. Lasse, T. Ohshima, J. Ul Hassan, N. Tien Son, S.-Y. Lee, J. Wrachtrup, Bright single photon sources in lateral silicon carbide light emitting diodes, Appl. Phys. Lett. 112, 231103 (2018).
P. V. Klimov, A. L. Falk, B. B. Buckley, D. D. Awschalom, Electrically Driven Spin Resonance in Silicon Carbide Color Centers, Phys. Rev. Lett. 112, 087601 (2014).
M. W. Doherty, C. a. Meriles, A. Alkauskas, H. Fedder, M. J. Sellars, N. B. Manson, Towards a Room-Temperature Spin Quantum Bus in Diamond via Electron Photoionization, Transport, and Capture, Phys. Rev. X. 6, 041035 (2016).
M. Niethammer, M. Widmann, T. Rendler, N. Morioka, Y.-C. Chen, R. Stohr, A. Mukherjee, J. Ul Hassan, N. Tien Son, S.-Y. Lee, J. Isoya, J. Wrachtrup, Coherent electrical readout of defect spins in

(56) References Cited

OTHER PUBLICATIONS

4H—SiC at ambient conditions by photo-ionization, in press (available at http://arxiv.org/abs/1903.12236).

M. Widmann, S.-Y. Lee, T. Rendler, N. T. Son, H. Fedder, S. Paik, L.-P. Yang, N. Zhao, S. Yang, I. Booker, A. Denisenko, M. Jamali, S. A. Momenzadeh, I. Gerhardt, T. Ohshima, A. Gali, E. Janzén, J. Wrachtrup, Coherent control of single spins in silicon carbide at room temperature, Nat. Mater. 14, 164-168 (2015).

N. T. Son, P. Carlsson, J. U. Hassan, E. Janzén, T. Umeda, J. Isoya, A. Gali, M. Bockstedte, N. Morishita, T. Ohshima, H. Itoh, E. Janze, T. Umeda, J. Isoya, A. Gali, M. Bockstedte, N. Morishita, T. Ohshima, H. Itoh et al., Divacancy in 4H—SiC, Phys. Rev. Lett. 96, 8-11 (2006).

A. Beste, D. E. Taylor, D. A. Golter, C. W. Lai, Charge state switching of the divacancy defect in 4H—SiC, Phys. Rev. B. 98, 1-9 (2018).

M. Shimizu, T. Makino, T. Iwasaki, K. Tahara, H. Kato, N. Mizuochi, S. Yamasaki, M. Hatano, Charge-state control of ensemble of nitrogen vacancy centers by n-i-n diamond junctions, Appl. Phys. Express. 11, 033004 (2018).

K. Ohno, F. Joseph Heremans, L. C. Bassett, B. a. Myers, D. M. Toyli, A. C. Bleszynski Jayich, C. J. Palmstrom, D. D. Awschalom, C. J. Palmstrøm, D. D. Awschalom, Engineering shallow spins in diamond with nitrogen delta-doping, Appl. Phys. Lett. 101, 082413 (2012).

J. R. Maze, a Gali, E. Togan, Y. Chu, A. Trifonov, E. Kaxiras, M. D. Lukin, Properties of nitrogen-vacancy centers in diamond: the group theoretic approach, New J. Phys. 13, 025025 (2011).

S. J. Whiteley, G. Wolfowicz, C. P. Anderson, A. Bourassa, H. Ma, M. Ye, G. Koolstra, K. J. Satzinger, M. V. Holt, F. J. Heremans, A. N. Cleland, D. I. Schuster, G. Galli, D. D. Awschalom, Spin-phonon interactions in silicon carbide addressed by Gaussian acoustics, Nat. Phys. 15 (2019), doi:10.1038/s41567-019-0420-0.

K. C. Miao, A. Bourassa, C. P. Anderson, S. J. Whiteley, A. L. Crook, S. L. Bayliss, G. Wolfowicz, H. Abe, T. Ohshima, Electrically-driven optical interferometry in silicon carbide spin defects, 1-8.

J. Forneris, S. Ditalia Tchernij, P. Traina, E. Moreva, N. Skukan, M. Jakši'cjakši'c, V. Grilj, F. Bosia, E. Enrico, G. Amato, I. P. Degiovanni, B. Naydenov, F. Jelezko, M. Genovese, P. Olivero, Mapping the Local Spatial Charge in Defective Diamond by Means of N-V Sensors-A Self-Diagnostic Concept, Phys. Rev. Appl. 10, 14024 (2018).

S. Wengerowsky, S. K. Joshi, F. Steinlechner, H. Hübel, R. Ursin, An entanglement-based wavelength-multiplexed quantum communication network, Nature. 564, 225-228 (2018).

D. A. Broadway, N. Dontschuk, A. Tsai, S. E. Lillie, C. T.-K. Lew, J. C. McCallum, B. C. Johnson, M. W. Doherty, A. Stacey, L. C. L. Hollenberg, J.-P. Tetienne, Spatial mapping of band bending in semiconductor devices using in situ quantum sensors, Nat. Electron. 1, 502-507 (2018).

A. N. Vamivakas, Y. Zhao, S. Fält, A. Badolato, J. M. Taylor, M. Atatüre, Nanoscale Optical Electrometer, Phys. Rev. Lett. 107, 166802 (2011).

F. Dolde, H. Fedder, M. W. Doherty, T. Nobauer, F. Rempp, G. Balasubramanian, T. Wolf, F. Reinhard, L. C. L. Hollenberg, F. Jelezko, J. Wrachtrup, Electric-field sensing using single diamond spins, Nat. Phys. 7, 459-463 (2011).

G. Wolfowicz, S. J. Whiteley, D. D. Awschalom, Electrometry by optical charge conversion of deep defects in 4H—SiC., Proc. Natl. Acad. Sci. U. S. A. 115, 7879-7883 (2018).

N. R. Jungwirth, B. Calderon, Y. Ji, M. G. Spencer, M. E. Flatté, G. D. Fuchs, Temperature Dependence of Wavelength Selectable Zero-Phonon Emission from Single Defects in Hexagonal Boron Nitride, Nano Lett. 16, 6052-6057 (2016).

S. O. Hruszkewycz, S. Maddali, C. P. Anderson, W. Cha, K. C. Miao, M. J. Highland, A. Ulvestad, D. D. Awschalom, F. J. Heremans, Strain annealing of SiC nanoparticles revealed through Bragg coherent diffraction imaging for quantum technologies, Phys. Rev. Mater. 2, 086001 (2018).

H. Thyrrestrup, G. Kirs, H. Le Jeannic, T. Pregnolato, L. Zhai, L. Raahauge, L. Midolo, N. Rotenberg, A. Javadi, D. Schott, A. D. Wieck, A. Ludwig, M. C. Lo, I. So, R. J. Warburton, P. Lodahl, G. Kiršanskė, H. Le Jeannic, T. Pregnolato et al., Quantum Optics with Near-Lifetime-Limited Quantum-Dot Transitions in a Nanophotonic Waveguide, Nano Lett. 18, 49 (2018).

M. C. Löbl, I. Söllner, A. Javadi, T. Pregnolato, R. Schott, L. Midolo, A. V. Kuhlmann, S. Stobbe, A. D. Wieck, P. Lodahl, A. Ludwig, R. J. Warburton, Narrow optical linewidths and spin pumping on charge-tunable close-to-surface self-assembled quantum dots in an ultrathin diode, Phys. Rev. B. 96, 165440 (2017).

C. Chakraborty, L. Kinnischtzke, K. M. Goodfellow, R. Beams, A. N. Vamivakas, Voltage-controlled quantum light from an atomically thin semiconductor, Nat. Nanotechnol. 10, 507-511 (2015).

C. Schreyvogel, V. Polyakov, R. Wunderlich, J. Meijer, C. E. Nebel, Active charge state control of single NV centres in diamond by in-plane Al-Schottky junctions., Sci. Rep. 5, 12160 (2015).

H. Kato, M. Wolfer, C. Schreyvogel, M. Kunzer, W. Müller-Sebert, H. Obloh, S. Yamasaki, C. Nebel, Tunable light emission from nitrogen-vacancy centers in single crystal diamond PIN diodes, Appl. Phys. Lett. 102, 1-5 (2013).

F. J. Heremans, G. D. Fuchs, C. F. Wang, R. Hanson, D. D. Awschalom, Generation and transport of photoexcited electrons in single-crystal diamond, Appl. Phys. Lett. 94, 0-3 (2009).

D. A. Golter, C. W. Lai, Optical switching of defect charge states in 4H—SiC, Sci. Rep. 7, 13406 (2017).

B. Magnusson, N. T. Son, A. Csóré, A. Gällström, T. Ohshima, A. Gali, I. G. Ivanov, Excitation properties of the divacancy in 4 H—SiC, Phys. Rev. B. 98, 195202 (2018).

N. Aslam, G. Waldherr, P. Neumann, F. Jelezko, J. Wrachtrup, Photo-induced ionization dynamics of the nitrogen vacancy defect in diamond investigated by single-shot charge state detection, New J. Phys. 15, 013064 (2013).

M. Bockstedte, F. Schütz, T. Garratt, V. Ivády, A. Gali, Ab initio description of highly correlated states in defects for realizing quantum bits, Npj Quantum Mater. 3, 31 (2018).

P. Siyushev, H. Pinto, M. Vörös, A. Gali, F. Jelezko, J. Wrachtrup, Optically Controlled Switching of the Charge State of a Single Nitrogen-Vacancy Center in Diamond at Cryogenic Temperatures, Phys. Rev. Lett. 110, 167402 (2013).

A. V. Kuhlmann, J. Houel, A. Ludwig, L. Greuter, D. Reuter, A. D. Wieck, M. Poggio, R. J. Warburton, Charge noise and spin noise in a semiconductor quantum device, Nat. Phys. 9, 570-575 (2013).

D. M. Toyli, C. D. Weis, G. D. Fuchs, T. Schenkel, D. D. Awschalom, Chip-Scale Nanofabrication of Single Spins and Spin Arrays in Diamond, Nano Lett. 10, 3168-3172 (2010).

M. E. (Mikhail E. Levinshteĭn, S. L. Rumyantsev, M. Shur, Properties of advanced semiconductor materials : GaN, AIN, InN, BN, SiC, SiGe, (Wiley, 2001).

J. Lutz, H. Schlangenotto, U. Scheuermann, R. De Doncker, Semiconductor Power Devices, (Springer Berlin Heidelberg, Berlin, Heidelberg, 2011; http://link.springer.com/10.1007/978-3-642-11125-9).

J. Michl, J. Steiner, A. Denisenko, A. Bulau, A. Zimmermann, K. Nakamura, H. Sumiya, S. Onoda, P. Neumann, J. Isoya, J. Wrachtrup, Robust and accurate electric field sensing with solid state spin ensembles, "Robust and accurate electric field sensing with solid state spin ensembles" (2019), (available at https://arxiv.org/pdf/1901.01614.pdf).

K.-M. C. Fu, C. Santori, P. E. Barclay, L. J. Rogers, N. B. Manson, R. G. Beausoleil, Observation of the Dynamic Jahn-Teller Effect in the Excited States of Nitrogen-Vacancy Centers in Diamond, Phys. Rev. Lett. 103 (2009), doi:10.1103/PhysRevLett.103.256404.

K. D. Jahnke, A. Sipahigil, J. M. Binder, M. W. Doherty, M. Metsch, L. J. Rogers, N. B. Manson, M. D. Lukin, F. Jelezko, Electron-phonon processes of the silicon-vacancy centre in diamond, New J. Phys. 17, 043011 (2015).

H. Jayakumar, J. Henshaw, S. Dhomkar, D. Pagliero, A. Laraoui, N. B. Manson, R. Albu, M. W. Doherty, C. A. Meriles, Optical patterning of trapped charge in nitrogen-doped diamond, Nat. Commun. 7, 12660 (2016).

C. J. Cochrane, P. M. Lenahan, a. J. Lelis, Identification of a silicon vacancy as an important defect in 4H SiC metal oxide semicon-

(56) References Cited

OTHER PUBLICATIONS ducting field effect transistor using spin dependent recombination, Appl. Phys. Lett. 100, 10-13 (2012).

S. M. Ross, Introduction to Probability and Statistics for Engineers and Scientists., (Elsevier Science, 2009).

A. Krtschil, H. Witte, M. Lisker, J. Christen, A. Krost, U. Birkle, S. Einfeldt, D. Hommel, F. Scholz, J. Off, M. Stutzmann, Photoelectric properties of the 0.44 eV deep level-to-band transition in gallium nitride investigated by optical admittance spectroscopy, Appl. Phys. Lett. 77, 546-548 (2000).

P. Tamarat, T. Gaebel, J. R. Rabeau, M. Khan, A. D. Greentree, H. Wilson, L. C. L. Hollenberg, S. Prawer, P. Hemmer, F. Jelezko, J. Wrachtrup, Stark Shift Control of Single Optical Centers in Diamond, Phys. Rev. Lett. 97, 083002 (2006).

S. Meesala, Y. Sohn, H. A. Atikian, S. Kim, M. J. Burek, J. T. Choy, M. Lon, Enhanced Strain Coupling of Nitrogen-Vacancy Spins to Nanoscale Diamond Cantilevers, 034010, 1-8 (2016).

T. Schröder, M. E. Trusheim, M. Walsh, L. Li, J. Zheng, M. Schukraft, A. Sipahigil, R. E. Evans, D. D. Sukachev, C. T. Nguyen, J. L. Pacheco, R. M. Camacho, E. S. Bielejec, M. D. Lukin, D. Englund, Scalable focused ion beam creation of nearly lifetime-limited single quantum emitters in diamond nanostructures, Nat. Commun. 8 (2017), doi:10.1038/ncomms15376.

R. Nagy, M. Niethammer, M. Widmann, Y.-C. Chen, P. Udvarhelyi, C. Bonato, J. U. Hassan, R. Karhu, I. G. Ivanov, N. T. Son, J. R. Maze, T. Ohshima, Ö. O. Soykal, Á. Gali, S.-Y. Lee, F. Kaiser, J. Wrachtrup, High-fidelity spin and optical control of single silicon vacancy centres in silicon carbide. Nat. Commun. 10, 1954 (2019).

H. B. Banks, Ö. O. Soykal, R. L. Myers-Ward, D. K. Gaskill, T. L. Reinecke, S. G. Carter, Oney, O. Soykal, R. L. Myers-Ward, D. K. Gaskill, T. L. Reinecke, S. G. Carter, Resonant optical spin initialization and readout of single silicon vacancies in 4H—SiC , Phys. Rev. Appl. 11, 1-9 (2019).

A. J. Bennett, R. B. Patel, J. Skiba-Szymanska, C.A. Nicoll, I. Farrer, D. A. Ritchie, A. J. Shields, Giant Stark effect in the emission of single semiconducto quantom dots, (American Institute of Physics, 2010; https://arxiv.org/ftp/arxiv/papers/1011/1011.2436.pdf), vol. 97.

N. Ha, T. Mano, Y.-L. Chou, Y.-N. Wu, S.-J. Cheng, J. Bocquel, P. M. Koenraad, A. Ohtake, Y. Sakuma, K. Sakoda, T. Kuroda, Size-dependent line broadening in the emission spectra of single GaAs quantum dots: Impact of surface charge on spectral diffusion, Phys. Rev. B. 92, 75306 (2015).

S. Aghaeimeibodi, C. M. Lee, M. A. Buyukkaya, C. J. K. Richardson, E. Waks, Large stark tuning of InAs/InP quantum dots, (American Institute of Physics Inc., 2019; https://arxiv.org/ftp/arxiv/papers/1812/1812.01616.pdf), vol. 114.

N. Nikolay, N. Mendelson, N. Sadzak, F. Böhm, T. T. Tran, B. Sontheimer, I. Aharonovich, O. Benson, Very Large and Reversible Stark Shift Tuning of Single Emitters in Layered Hexagonal Boron Nitride, Phys. Rev. Appl. 11, 041001 (2018).

G. Noh, D. Choi, J.-H. Kim, D.-G. Im, Y.-H. Kim, H. Seo, J. Lee, Stark Tuning of Single-Photon Emitters in Hexagonal Boron Nitride, Nano Lett. 18, 5 (2018).

C. Chakraborty, K. M. Goodfellow, S. Dhara, A. Yoshimura, V. Meunier, A. N. Vamivakas, Quantum-Confined Stark Effect of Individual Defects in a van der Waals Heterostructure, Nano Lett. 17, 2253-2258 (2017).

J. Klein, J. Wierzbowski, A. Regler, J. Becker, F. Heimbach, K. Müller, M. Kaniber, J. J. Finely, Stark Effect Spectroscopy of Mono- and Few-Layer MoS2, Nano Lett. 16, 1554-1559 (2016).

International Search Report mailed Jul. 27, 2020 for International Application No. PCT/US20/22702.

* cited by examiner

| λ (nm) | $\sigma_a (cm^{-2})$ | $\sigma_i (cm^{-2})$ | $\sigma_r (cm^{-2})$ |
|---|---|---|---|
| 1131 | $8 \pm 2 \times 10^{-18}$ | $5.0 \pm 0.2 \times 10^{-18}$ | 0 |
| 975 | $9.4 \pm 0.3 \times 10^{-17}$ | $1.2 \pm 0.2 \times 10^{-17}$ | 0 |
| 905 | $4.0 \pm 0.4 \times 10^{-17}$ | $8.5 \pm 0.4 \times 10^{-18}$ | $2.90 \pm 0.03 \times 10^{-20}$ |
| 705 | 0 | — | $3.50 \pm 0.04 \times 10^{-19}$ |

Figure 23

ELECTRICALLY TUNABLE QUANTUM INFORMATION PROCESSING DEVICE BASED ON A DOPED SEMICONDUCTOR STRUCTURE EMBEDDED WITH A DEFECT

CROSS REFERENCES

This application is a based on and claims priority to PCT Patent Application No. PCT/US20/22702, filed on Mar. 13, 2020, which is based on U.S. Provisional Application 62/819,221 filed on Mar. 15, 2019 and U.S. Provisional Patent Application No. 62/863,674, filed on Jun. 19, 2019. The PCT Patent Application and the provisional patent applications are herein incorporated by reference in their entireties.

GOVERNMENT LICENSE RIGHTS

This invention was made with government support under grant numbers W911NF-15-2-0058 awarded by the Army Research Office and grant numbers FA9550-12-1-0004, FA9550-14-1-0231, FA9550-15-1-0029 awarded by the Air Force Office of Scientific Research, grant numbers 1641099, DMR1420709 and EECS1542205 awarded by the National Science Foundation, grant number D18AC00015KK1932 awarded by the Department of Defense, and grant number N00014-17-1-3026 awarded by the Office of Navy Research. The government has certain rights in the invention.

TECHNICAL FIELD

This disclosure relates to semiconductor optoelectronic devices.

BACKGROUND

Solid-state defects may be used as building blocks for quantum information processing devices and systems. Various quantum information processing functions require that some of the properties of the solid-state defects be controllable/tunable via external electric or optical means. It may be further desirable that other quantum properties of the solid-state defects critical for preserving quantum information are not adversely affected by the external electric or optical control.

SUMMARY

This disclosure relates to optoelectronic semiconductor devices.

In one embodiment, an optical source device is disclosed, the optical source device includes a first layer of a first semiconductor; a second layer of a second semiconductor; a third layer of a third semiconductor located between the first and second layers, the third layer comprising a defect addressable by optical means; a first terminal in electric contact with the first layer; and a second terminal in electric contract with the second layer. The defect may include an optically bright excited state for generating an optical emission. The first and second terminals are configured to apply an electric bias across the third layer. The optical source device is adapted to receive a first optical excitation for preparing the defect into the optically bright excited state for generating the optical emission, and the electric bias is configured to control a timing, an emission spectral linewidth, or a wavelength of the optical emission from the defect.

In another embodiment, another optical source device is disclosed. The optical source device includes a first layer of a first semiconductor; a second layer of a second semiconductor; a third layer of a third semiconductor located between the first and second layers, the third layer comprising a defect addressable by optical means. The defect may include an optically bright excited state for generating an optical emission. The optical source device is adapted to receive a first optical excitation for preparing the defect into the optically bright excited state for generating the optical emission; and the optical source device is further adapted to receive a second optical excitation for charge repumping of the defect.

In another embodiment, optical source device is disclosed. The optical source device includes, a first layer of a first semiconductor; a second layer of a second semiconductor; a third layer of a third semiconductor located between the first and second layers, the third layer comprising a defect; a first terminal in electric contact with the first layer; and a second terminal in electric contract with the second layer. The first and second terminals are configured to apply a forward electric bias across the third layer to electrically pump the defect, and the defect generates an optical emission in response to the forward electric bias.

In another embodiment, a method for generating an optical emission is disclosed. The method includes providing an optical source device containing a first layer of a first semiconductor; a second layer of a second semiconductor; a third layer of a third semiconductor located between the first and second layers. The third layer includes a defect addressable by optical means. The optical source devices further include a first terminal in electric contact with the first layer; and a second terminal in electric contract with the second layer. The defect includes an optically bright excited state for generating an optical emission. The method further includes applying an electric bias via the first and second terminals across the third layer; receiving a first optical excitation for preparing the defect into the optically bright excited state; generating the optical emission from radiative relaxation of the optically bright excited state of the defect; and adjusting the electric bias to control one or more of: a timing, an emission spectral linewidth, and a wavelength of the optical emission from the defect.

In another embodiment, a method for generating an optical emission is disclosed. The method includes providing an optical source device containing a first layer of a first semiconductor; a second layer of a second semiconductor; and a third layer of a third semiconductor located between the first and second layers. The third layer comprising a defect addressable by optical means. The defect includes an optically bright excited state for generating an optical emission. The method further includes receiving a first optical excitation for preparing the defect into the optically bright excited state and receiving a second optical excitation for charge repumping of the defect.

In another embodiment, an optical source device is disclosed. The optical device includes a semiconductor structure containing a defect addressable by optical means; a first terminal in electric contact with a first surface of the semiconductor structure; and a second terminal in electric contract with a second surface of the semiconductor structure. The defect includes an optically bright excited state for generating an optical emission. The first and second terminals are configured to apply an electric bias across the semiconductor structure. The optical source device is adapted to receive a first optical excitation for preparing the defect into the optically bright excited state for generating the optical emission and the electric bias is configured to control a timing, an emission spectral linewidth, or a wavelength of the optical emission from the defect.

In another embodiment, an optical source device is disclosed. The optical source device includes, comprising a semiconductor structure comprising a defect addressable by optical means. The defect includes an optically bright excited state for generating an optical emission. The optical source device is adapted to receive a first optical excitation for preparing the defect into the optically bright excited state for generating the optical emission; and the optical source device is further adapted to receive a second optical excitation for charge repumping of the defect.

In another embodiment, a method for generating an optical emission is disclosed. The method includes providing an optical source device containing a semiconductor structure comprising a defect addressable by optical means; a first terminal in electric contact with the semiconductor structure; and a second terminal in electric contract with the semiconductor structure. The defect comprises an optically bright excited state for generating an optical emission. The method further include applying an electric bias via the first and second terminals across the defect; receiving a first optical excitation for preparing the defect into the optically bright excited state; generating the optical emission from radiative relaxation of the optically bright excited state of the defect; and adjusting the electric bias to control one or more of: a timing, an emission spectral linewidth, and a wavelength of the optical emission from the defect.

In another embodiment, a method for generating an optical emission is disclosed. The method includes providing an optical source device containing a semiconductor structure comprising a defect addressable by optical means. The defect comprises an optically bright excited state for generating an optical emission. The method further includes receiving a first optical excitation for preparing the defect into the optically bright excited state and receiving a second optical excitation for charge repumping of the defect.

In any of the embodiments above, the first layer, the second layer, and the third layer may be the same or different semiconductors. One or more of the layers may be silicon carbide. Each of the layers may be doped or intrinsic.

BRIEF DESCRIPTION OF THE DRAWINGS

The system and method disclosed herein may be better understood with reference to the following drawings and description. Non-limiting and non-exhaustive embodiments are described with reference to the following drawings. The components in the drawings are not necessarily to scale, emphasis instead being placed upon illustrating the principles of the invention.

FIG. 23 shows example absorption, ionization, and repumping/resetting cross sections for optical excitation at various relevant wavelengths.

DETAILED DESCRIPTION

Introduction

Electronic states of defects embedded in solid-state systems may be manipulated electrically and/or optically to achieve functions that may be employed in various applications. Electronic and/or optical devices thus may be fabricated based on these solid-state defects. Defects embedded in solid-state system may be further isolated spatially or spectrally and individually addressed/manipulated. The term "isolated spatially" is not used to indicate any absolute spatial separation. Rather, it is used to mean, for example, that the defect may be resolved from other neighboring defects by the relevant optical means with the relevant achievable optical resolution. Such single defects may exhibit atomic like properties and long quantum coherence time. As such, quantum information processing devices may be fabricated and configured using single solid-state defects as building blocks. Quantum information processing applications may include but are not limited to quantum sensing, computation, and communications. For example, the atomic like electronic energy level structures and electronic/optical transitions in single solid-state defects may be used in the preparation, logic manipulation, and readout of quantum bits. Processing of quantum information carried by these defect-based quantum bits may include but is not limited to generation of single photons, generation of spin-photon entanglement, high fidelity single shot readout, entanglement distillation, and quantum state transportation/teleportation, spin-to-charge conversion, and quantum sensing. The term "defects" as used in this disclosure may refer to any imperfections of a lattice structure. While some types of vacancies or impurities are described as examples of solid-state defects in the various implementations below, the underlying principles apples to other embedded solid-sate single quantum emitters that may be more complex than atomic vacancies and impurities. The term "defects" may be used to refer to these other types of single quantum emitters in addition to vacancies and impurities.

Figure 1:
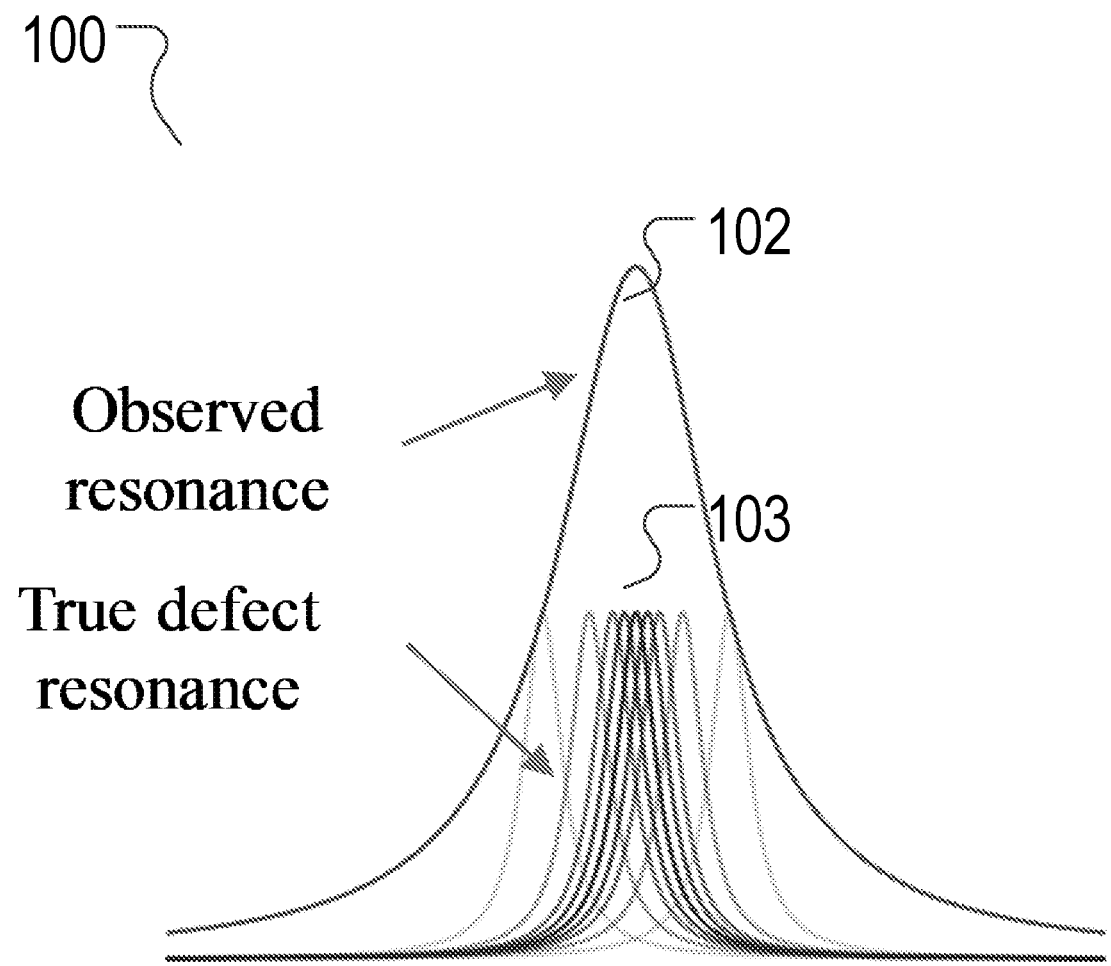
FIG. 1 illustrates effect of spectral diffusion of an emission line in a single solid-state defect.

In some implementations, a single defect in a solid-state material may provide charge states (charged or neutral) that can be electrically and/or optically controlled for quantum information processing. The electric charge environment for each single defect within a solid-state host may be unstable during optical/electric operations due to, for example, presence of free carriers, traps for charges, carrier ionization, and other processes in the defects. The electric charge present in one single defect may exert long-range effect on other single defects via electric interaction. As such, charge variation and the charge instability (hence the resulting instability in the electric environment for single defects) may cause, for example, spectral diffusion of optical emission from, for example, an optically bright excited state of a single defect, as shown in 100 of FIG. 1. In particular, 103 in FIG. 1 shows an intrinsic, lifetime-limited optical emission spectrum of an optically bright defect state that may be shifted uncontrollably due to charge instability and the resulting instability in its electric environment, leading to an observable spectral line 102 that is diffusively broadened.

Such charge instability and spectral diffusion give rise to major challenges in applying these solid-state defects in quantum information processing applications. For example, to generate high-level quantum entanglement, two quantum emitters (e.g., two single solid-state defects) need to be spectrally indistinguishable and narrow in order to achieve high contrast, Hong-Ou-Mandel interference. Further, for practical quantum information processing applications, the quantum emitters are preferably continuously optical active without randomly falling into any dark states. Charge instability, in addition to causing spectral diffusion, may further cause these quantum emitters to fall into the dark states leading to an unwanted blinking of the emission from these quantum emitters. Such charge instability thus play an adverse role in reducing entanglement rate and fidelity by broadening the emission spectrum, reducing spectral indistinguishability of photons generated by these defects, and by causing blinking behavior. As such, controlling and maintaining charge stability of the single defect environment is critical for reducing the adverse spectral diffusion and blinking. For another example, fluctuating charge environment may interact with the ground state spin of the defects, reducing quantum coherence of the ground spin state that are critical for quantum information processing applications.

This disclosure describes, in detail, device implementations of a single solid-state defect system that provides a charge stable environment by (1) using electric bias to deplete free carriers and trapped charges, and (2) stabilizing charges in the defects via control of the fast carrier recapture or optical charge repumping/resetting. As a result of such control, a narrow emission line that is nearly lifetime-limited may be achieved with minimal blinking for facilitating practical deployment of these solid-state defects in quantum information processing applications.

Charge stability alone may not be sufficient for providing, for example, spectral indistinguishability of photons generated by quantum emitters based on single solid-state defects. In particular, while the solid-state defects in an optical source device may be controlled to achieve charge stability and narrow emission lines, two single defect quantum emitters may, nevertheless, experience different local environment and thus generate photons of slightly different wavelength with insufficient spectral indistinguishability. It is, therefore, desirable to provide a controllable tuning capability in these quantum information processing devices for shifting the narrow spectral lines of single, solid-state defects into resonance to achieve sufficient spectral indistinguishability. In this respect, the device implementations described in this disclosure also provide wide tunability of the narrow single defect spectral lines using externally controllable electric bias to induce large Stark shift. As such, spectral lines of single, charge-stabilized defects may be further tuned into resonance to achieve the desired spectral indistinguishability. Devices based on these single, solid-date defects may be designed to achieve large Stark shift and provide wide emission wavelength tunability for generating indistinguishable photons at various desired wavelengths.

The implementations disclosed herein facilitate electrical and or optical driven schemes that provide timing and wavelength control of optical emission with stable wavelength and narrow emission spectral line. As a result, these implementations provide spectrally narrow, electrically triggered/gated, and/or widely wavelength-tunable single photons for quantum information processing. The timing and wavelength tunability capabilities are achieved in these implementations without degrading the high quality spin property (such as long coherence time) of the embedded defects that are critical characteristics for other quantum information manipulation processes in addition to functioning as a single photon source.

Merely by example, mature semiconductor technology for processing silicon carbide (SiC) material system may be utilized to create p-i-n homostructures embedded with defects in the form of vacancies or impurities for providing a controllable charge and electric field environment for narrowing optical lines, stabilizing charge levels, and creating large Stark shifts for the defect states. Such capabilities may be achieved by simply adjusting the external bias to the p-i-n homostructures. The neutral or charged defect states may be further manipulated, reset, and controlled by optical means under controllable electric bias. Various detailed measurements show that these semiconductor homostructures embedded with defects may function as basic building blocks of a powerful quantum platform, due to the narrow optical lines, long spin coherence, high fidelity control, electrical tunability and efficient charge repumping in these defects. This platform also opens unique avenues for single photon generation, spin-to-charge conversion, single-shot readout, electrically driven single photon emission, electrical control and readout of spin, all of which are building blocks for a quantum information processing system. The solid-state defects system may be further integrated into new and more complex device geometries. In particular, introducing high quality spin defects in commercial homostructures enables the fabrication of complex devices. For example, it's possible to use doped layers as in situ transparent native contacts to Stark tune defects in suspended photonic, phononic structures, MOSFETs, and APDs. These complex devices may enable the next generation of quantum devices linking spin and charge. Further, such integration of these devices into complex commercial structures may enable on-chip systems with embedded defects. For example, waveguides and other photonic elements (e.g., beam splitters, detectors) may be integrated on-chip. Such integration may be based compatible material processing methods (e.g., etching, deposition, etc.).

While the examples provided below are based on a semiconductor structure have p-i-n doping profile for achieving the various electric controls, the underlying principles applies to other types of doping profiles, such as n-i-n and p-i-p doping profiles. Further, while the disclosure below uses semiconductor homostructures as examples, the underlying principles applies to semiconductor heterostructures. In other words, the p-i-n, n-i-n, p-i-p or other device structures may each comprise a combination of different semiconductor materials.

Example P-I-N Diode Structure with Embedded Defects

Figure 2:
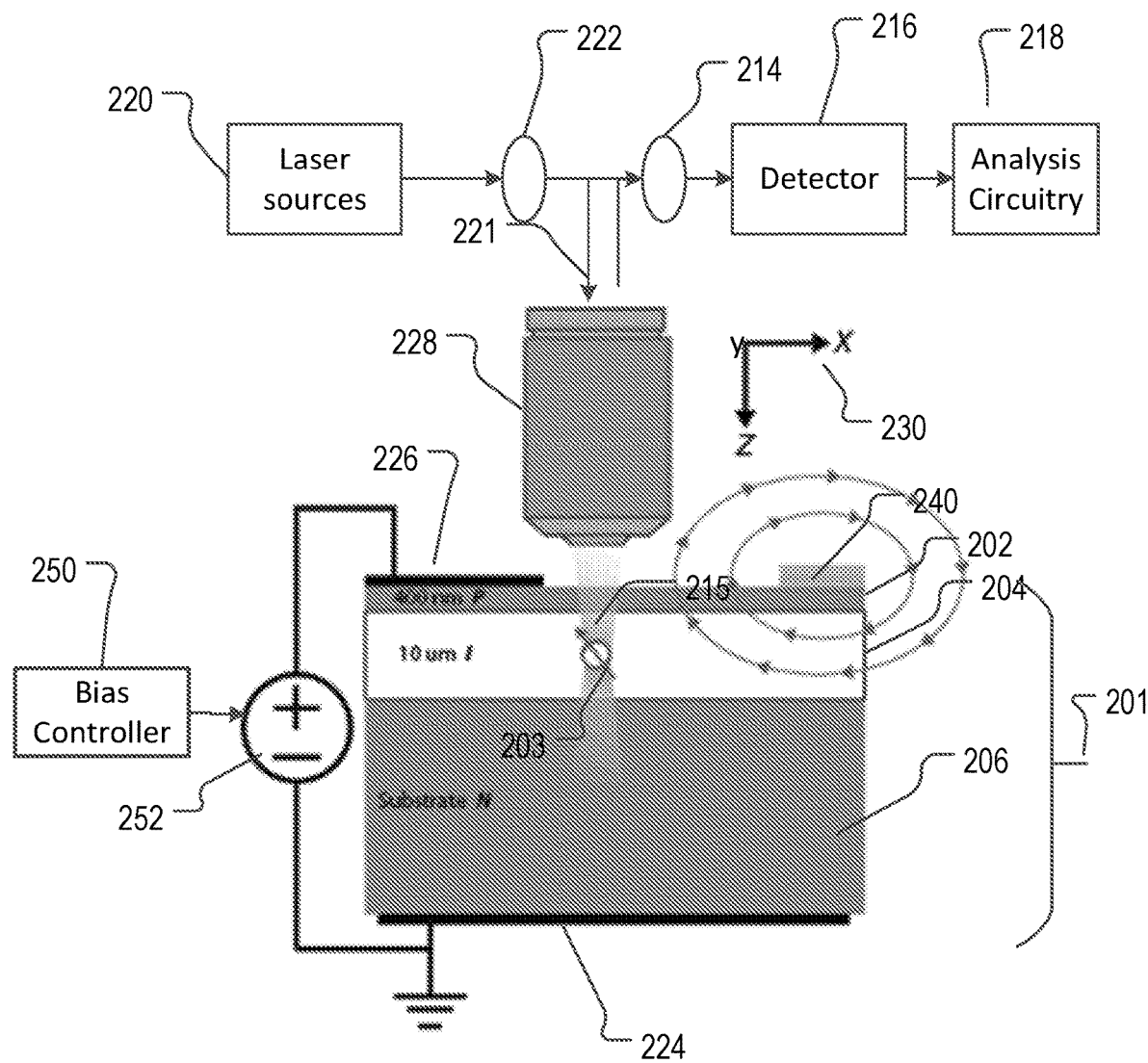
FIG. 2 illustrates an example p-i-n diode device that may be used for quantum information processing applications, and an example electric and optical driving configuration.

FIG. 2 shows an example p-i-n diode device 201 for a quantum information processing device. The p-i-n diode device 201 includes a p-doped layer 202, an intrinsic layer 204, and an n-doped layer 206. The intrinsic layer 204, for example, may include defects 203. As an example, a doped substrate may function as the n-doped layer 206 of the p-i-n diode device 201. The p-i-n diode device 201 may further include electrodes 226 and 224 for applying electric bias across the diode device. The electric bias may be applied from bias source 252 under control of bias controller 250. The diode device, for example, may be forward biased, as shown by the polarity of the bias source 252. The bias controller 250 may control both timing and amplitude of the bias. In-plane direction for layers 202, 204, and 206 may be denoted by x-y, as indicated by 230. The direction perpendicular to the in-plane direction, denoted by z, is referred to as growth direction for the p-i-n diode device 201.

In addition to controlling the diode device using the bias controller 250 and bias source 252, the diode device may be further manipulated by electromagnetic radiation, such as lasers 221 from laser sources 220. Lasers 221 may be processed by optics 222. Lasers 220 may include a combination of laser beams having various resonant and non-resonant (with respect to the defect states of defects 203) wavelengths (or energy) and controllable timing and intensity. The laser beams may be directed to the diode device by optics 228. Optics 228, for example, may be a confocal microscope or other optical components having sub-wavelength spatial resolution. The optics 228 may be used to collect optical emission 215 from the p-i-n diode device 201. The optical emission may be further processed by optics 214 and detected by detector 216. The detected signal may then be processed by analysis circuitry 218 either in digital domain and/or analog domain.

The diode device may be based on various types of semiconductor material systems. For example, layers 202, 204 and 206 may be based on silicon carbide (SiC) crystal, as will be described in more detail below, and the defects in the intrinsic layer 204 may be divacancies occupying neighboring silicon and carbon sites, other types of vacancies, other types of impurities, or other quantum structures such as single photon emitting structures. The defects may be spatially separated and resolvable to form single defects.

Electrical Control of the P-I-N Diode Structure

Figure 3:
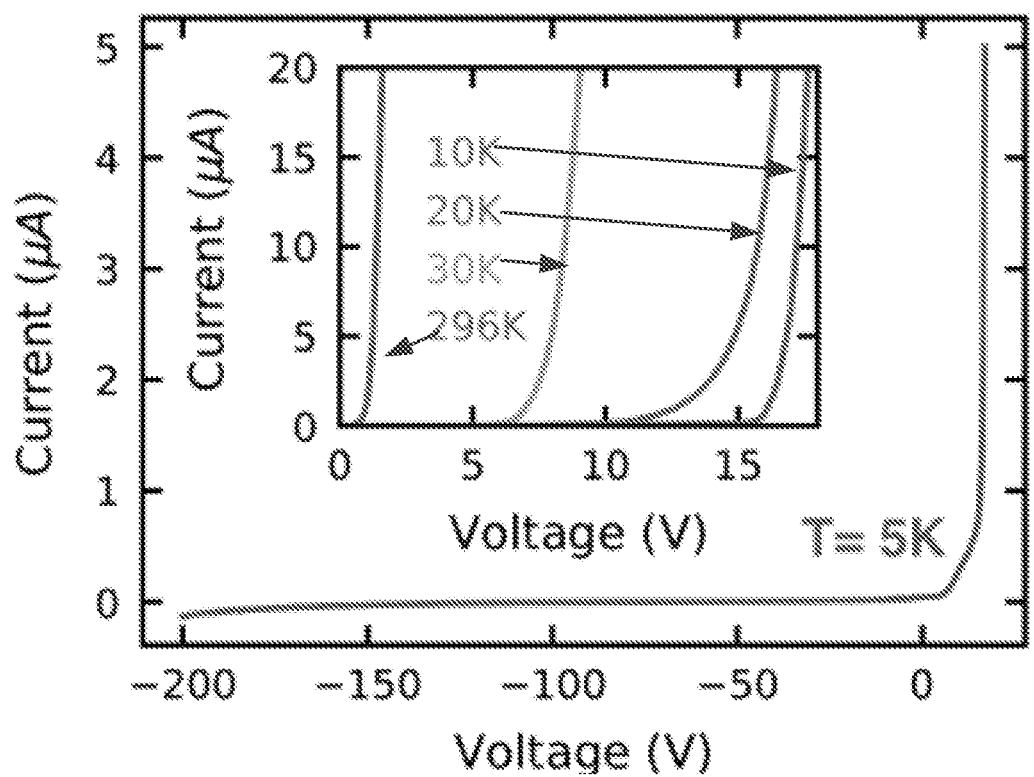
FIG. 3 shows example I-V curve for a p-i-n diode structure at various temperatures.

The electrodes 226 and 224 of FIG. 2, alternatively referred to as terminals or electric terminals, may be used to apply electric bias (alternatively referred to as bias) to the p-i-n diode structure 201. For example, the bias may be applied as a forward or reverse bias. The p-i-n diode structure may show rectifying behavior at room temperature. As the p-i-n diode structure 201 is cooled, the reverse bias leakage current drops and the forward bias turn-on behavior is pushed to higher voltages, as shown in the example I-V characteristics in FIG. 3 for different temperatures. FIG. 3 indicates that at low temperatures and due to diode rectification behavior of the p-i-n diode structure, large reverse biases are possible with low current.

Figure 4:
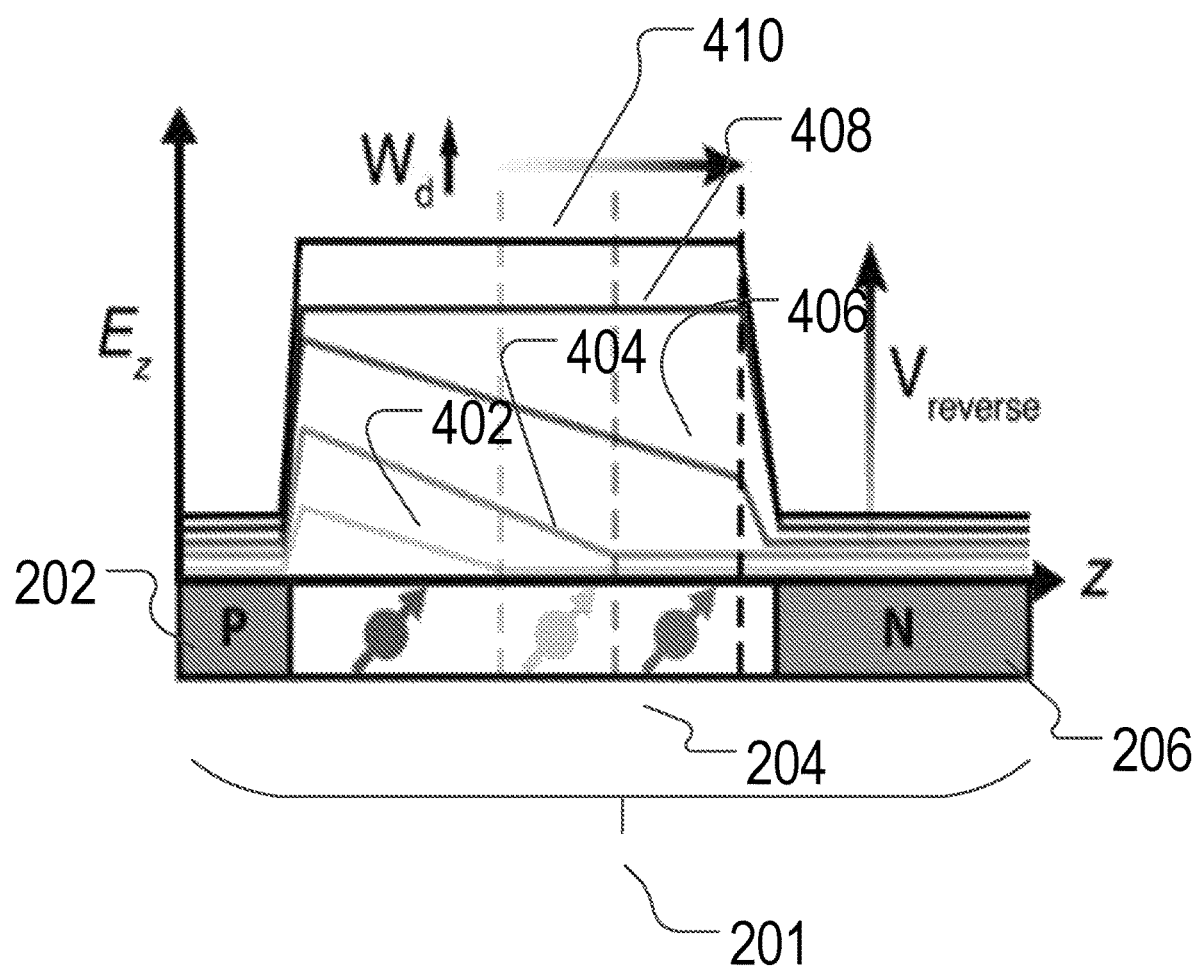
FIG. 4 illustrates example electric field profile in the intrinsic layer of the p-i-n diode structure under various level of reverse bias.

FIG. 4 further shows example electric field profile in the intrinsic layer 204 of the p-i-n diode structure 201 under reverse bias between the p layer 202 and n layer 206. The electric field profiles for increasing reverse bias are shown as curves 402, 404, 406, 408, and 410. As shown in FIG. 4, as the reverse bias increases (from 402 to 410), the defects 204 at various depths in the intrinsic layer 204 begin to experience varying electric field (starting from the side of the intrinsic layer closer to the p layer 202) as the depletion region grows, until the electric field becomes uniform across the entire intrinsic layer 204 at higher reverse bias (such as 408 and 410).

Figure 5A:
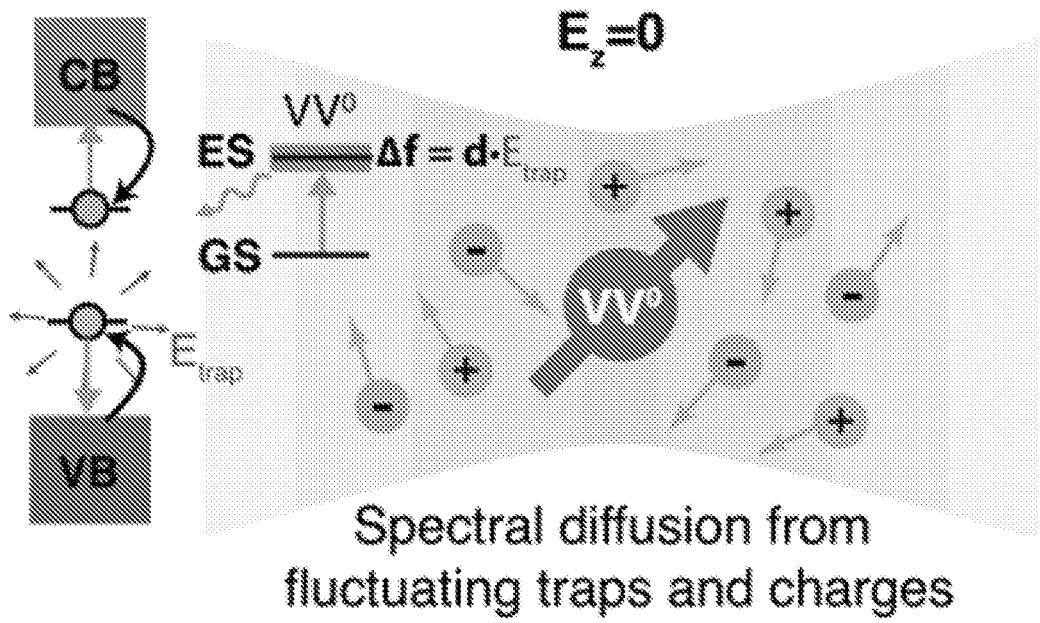
FIGS. 5a and 5b illustrate charge depletion and reduction of spectral diffusion when by applying sufficient reverse bias in the p-i-n diode device.
Figure 5B:
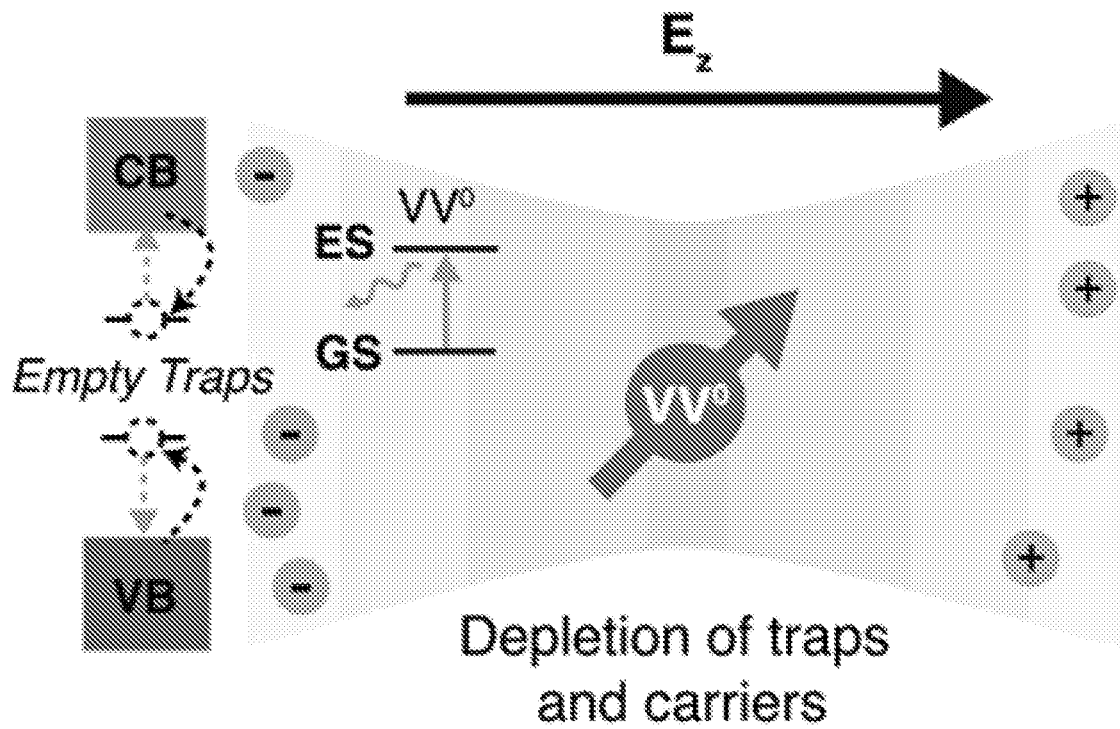

FIGS. 5a and 5b illustrate an additional effect of applying reverse bias between the p layer 202 and the n layer 206. FIG. 5(a) shows that at zero reverse bias ($E_z=0$), charges trapped around a defect may not be depleted, leading to fluctuating electric charge environment for the defect and a spectral diffusion of a transition energy between a ground state (GS) and an excited state (ES) of the defect. With sufficient reverse bias, however, as shown in FIG. 5b, the charges trapped and surrounding the defects may be depleted and as such, the charge fluctuation and the resulting spectral diffusion may be reduced. Detail of for such charge depletion and reduction of spectral diffusion are given below.

As such, the electric bias across the p-i-n diode structure may be applied such that the free carrier concentration level in the intrinsic layer is higher than a first predetermined charge concentration threshold level. For example, a bias smaller than a first reverse bias threshold may be used to achieve such carrier concentration. The electric bias may alternatively be applied such that the free carrier concentration level in the intrinsic layer is depleted to lower than a second predetermined charge concentration threshold level. For example, a bias higher than a second reverse bias threshold may be used to achieve such carrier concentration in depletion regime.

In addition, the reverse bias provides an electric field across the intrinsic layer 204 (as shown in FIG. 4), giving rise to Stark shift of energy levels of the defect states 506. Such Stark shift of the energy levels translates to tunability of the wavelength of the optical emission from the defect states. The thickness of the intrinsic layer may be reduced to achieve large electric field across the intrinsic layer, generating large Stark shift and wide wavelength tunability.

The p-i-n diode structure 201 thus provides a control of the electronic environment for the defects and may be used to redistribute environmental carriers such that charge instability in the defects is reduced, in addition to achieving emission wavelength tunability. In particular, the p-i-n structure may be biased at voltages that depletes free carriers and stabilizes charge environment for the defects in the intrinsic layer, and at the same time, generate large Stark shift in the defects.

Figure 32A:
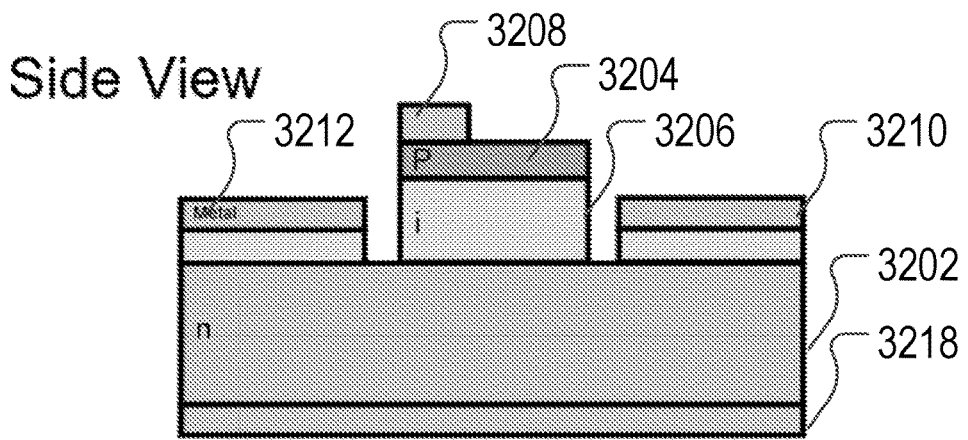
FIGS. 32a and 32b show an example electrode configuration for applying multidimensional electric field to the devices above.
Figure 32B:
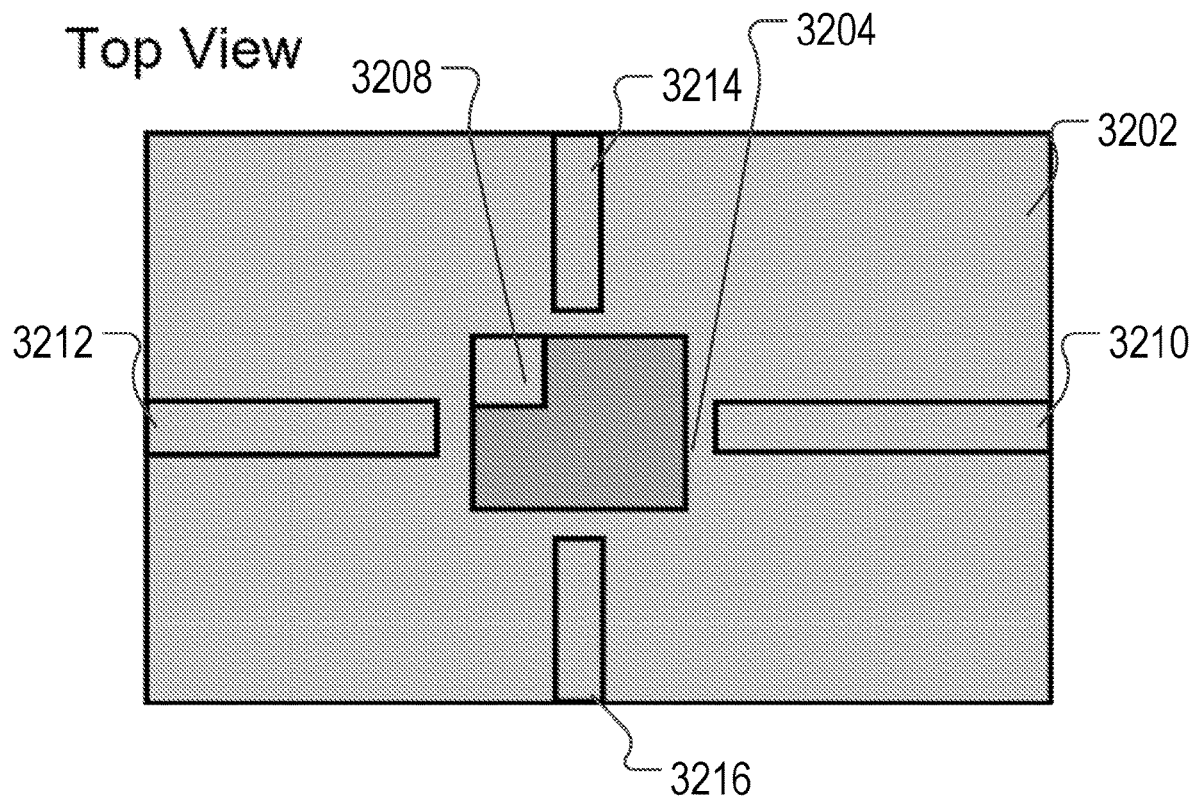

The electric bias above may be applied in specific orientation with respect to the crystal axis in the semiconductor host of the defects. For example, a large c-axis fields may be applied to shift the optical lines while introducing little or no transverse asymmetry (which may inadvertently cause faster rate of spin flip under optical excitation). When the electric filed is applied along transverse axis rather than c-axis of the defect, it may be used to counteract the asymmetry caused by strain (where the strain field, if not counteracted, may cause the inadvertent spin flip under optical excitation). FIGS. 32a and 32b show a side view and top view of an example electrode configuration of in a p-i-n structure for applying electric field in various directions. In particular, the defects may reside in the intrinsic layer 3206 between the p doped layer 3204 and the n doped substrate 3202. External bias applied to electrodes 3008, 3210, 3212, 3214, 3216, and 3218 may be controlled to adjust charge depletion and direction of the electric field in the intrinsic layer 3206.

A forward bias voltage can also be applied to the electrodes 224, 226 to stimulate electroluminescence of the defects. The forward bias across the p-i-n structure creates a current which electrically pumps the defect for generation of optical emission (particularly single photons for quantum information processing). Thus, the p-i-n structure with embedded defect can be used as an electrically-driven single photon infrared source without the use of lasers for pumping the defects.

Optical Control of the p-i-n Diode Structure

Each defect in the intrinsic layer 204 of FIGS. 1-5 may provide atomic-like energy levels that may be addressed and manipulated using optical fields, including but not limited to resonant excitation, off-resonant excitation, and non-resonant optical charge repumping. These energy levels may include spin degrees of freedom, and the different spin levels may split due to interactions of the electron/hole spins with its environment. Transition between the spin states may be specifically addressed and manipulated using either polarized or unpolarized optical excitations or excitations by radio frequency electromagnetic waves. Such radio frequency waves, for example, may be applied via additional electrodes of the p-i-n diode device 201, such as the electrode or stripline 240 shown in FIG. 2.

Optical field at various wavelength (or energy) may provide drastically different types of excitation in the defects of the p-i-n diode structure. For example, as described in more detail in various sections below, optical excitation may photo-ionize carriers in the defects of the p-i-n diode structure to excite the defect to an optically dark charge state. Such photo-ionization may be more effective and spin-selective with optical excitation that is resonant with an emission line of the defect (such and the 1131 nm emission line for the ZPL of a PL2 divacancies in SiC). Once a defect is photo-ionized into a dark charge state, it will stay dark until it becomes charge neutral again by, for example, recapture of free carriers and other processes. In some situations, photo-ionization is unwanted because it reduced emission efficiency of a single defect by trapping the defect into the long-lived dark state and because the ionization process in other traps in the defect environment generates some additional charge instability that causes more spectrally diffusion emission lines from the single defects.

Effect of the photo-ionization may be reduced by carrier recapturing in the defects. The source of carriers for recapturing by the defect may be from the free carriers in the host lattice. The free carriers in the host lattice (such as SiC) in the intrinsic layer (which may particularly be present at low temperatures), however, may be depleted when the reversely applied bias between the p layer and the n layer of the p-i-n structure becomes large (as described above with respect to FIG. 5). When the free carriers in the host lattice are depleted under large enough reverse bias, they are unavailable for recapture by the defects. As such, the defects will stay in the charged and optically dark ionized state for a long time without returning to a charge neutral state. On the contrary, under small or no reverse bias, the carriers in the host lattice may not be sufficiently depleted, and they may be available for recapture by the defects, leading to quick return of the defects to charge neutral state. Free carrier recapturing thus helps improving emission efficiency of the defects and improve the charge stability for the defects due to photo ionization (even though fluctuation in free carriers will lead to undesired spectral diffusion).

Reducing the effect of photo-ionization (alternative to free carrier recapture) can be achieved in an alternate manner. A non-resonant optical excitation (for example, an optical excitation having an energy higher than the resonant energy) may be used for repumping of the charge states of the defects, returning the defect from the ionized charged dark state to charge neutral state. Charge neutralization using optical repumping may be implemented at any bias (i.e., irrespective of whether the free carriers in the host lattice are depleted or not). Such non-resonant, optical excitation may be selected to cause insubstantial photo-ionization. Such repumping optical excitation may be referred to as charge resetting. A laser used for achieving the charge resetting function may be referred to as a reset laser. A reset laser may excite the defects in the form of laser pulses. The repumping optical excitation thus may help improve emission efficiency of the defects and reducing their charge instability.

Optical excitation may further be used to prepare the defects into an optically bright excited state for generation of optical emission (particularly single photons for quantum information processing). Such optical excitation may be a resonant excitation or may be near resonant excitation. In some implementations, such excitation for preparing the defects into the optically bright excited states may also inadvertently cause the undesired photo-ionization described above. The photo-ionization drives the defects into optically dark charge states and may be adverse to achieving high emission efficiency and to maintaining charge stability (for achieving narrow emission line) particularly when there is insufficient free carriers for quick recapture by the defects or optical repumping/resetting of charge in the defects.

Example Device Implementations a. Gated Photon Source for Quantum Information Processing As described above and in more detail below, a gated single photon source for quantum information processing may be implemented based on single defects in the p-i-n diode structure under electric bias and optical excitation. For example, an optical field (e.g., a laser) having a particular wavelength may be directed to the p-i-n diode structure, the bias across the p layer and n layer of the diode may be altered between a first value and a second value. The first value may be below a first threshold value and may provide a reverse bias to the diode such that the free carriers are relatively abundant in the intrinsic layer of the p-i-n diode. The second value may be higher than a second threshold value and may provide a reverse bias to the diode such that the free carriers in the intrinsic layer are depleted. The first threshold value may be the same as the second threshold value. Alternatively, the first threshold value may be different from the second threshold value. As described in more detail below, the two threshold values may be different because of some hysteresis process with respect to the bias.

The optical field may be focused using, for example, the confocal microscope 228 of FIG. 1 to spatially address a single defect. The optical field may be resonant or near resonant with the emission state of the single defect for effective excitation or preparation of the defect into the optically bright excited state. The optical field may alternatively be resonant or near resonant with some other defect state that may relax to the optically bright excited state for optical emission. In addition to exciting the defect into the optically bright excited state, the optical field may adversely cause photo-ionization of the defect into the charged dark state. When the bias is below the first threshold value, the free carriers in the intrinsic region of the diode may be quickly recaptured by the defect for returning the defect from the ionized and charged dark state to the charge neutral state which can be further excited into the optically bright excited state of the defect. As such, effect of photo-ionization on emission efficiency of the defects is reduced. Photons due to radiative relaxation of the optically bright excited state may be emitted from the defect with improved efficiency. The presence of free carrier under non-depleting bias for recapturing also help reduce charge instability induced by photo-ionization for the defects.

When the bias is above the second threshold value, the free carriers in the intrinsic region are depleted and not available for recapture by the photo-ionized defect. The defect may thus quickly go dark because the defect is driven by photo-ionization process into the charged dark state and cannot quickly return to charge neutral state due to a lack of free carrier recapturing. Optical emission therefore may be quenched at high reverse bias.

The implementation above based on the optical excitation and alternating bias control thus provides a gated single photon source. Emission of photons may be generated when lower reverse bias is applied. Emission of photons may be suppressed when higher reverse bias is applied. During time periods of low reverse bias (when the bias is below the first threshold value, and photons are emitted), the emission efficiency is improved due to the presence of free carriers available for recapturing by the defect to return the defect from the ionized dark state to a charge neutral state. Spectral diffusion may also be mediated to some extent as a result of improved charge stability due to carrier recapturing.

While the optical control/excitation above is described as single-wavelength excitation, optical excitation with other combination of wavelengths and timing may be implemented.

In the implementations above, a second charge repumping/resetting optical excitation may be further introduced during the time periods of low bias voltage. Such charge repumping/resetting process may help reducing the photo-ionization effect in addition to free carrier recapturing process. This second optical excitation may be turned off during the period of high reverse bias. Otherwise, the optical emission during this period may not be quenched. The wavelength of the second optical excitation may be selected such that the second optical excitation induces photo-ionization that is lower than a predetermined threshold. As such, the second optical excitation achieves charge repumping without causing much undesired photo-ionization.

b. Tunable Single Photon Source

As described in more detail below, a tunable single photon source for quantum information processing applications may be implemented based on the p-i-n diode structure above under electric bias and optical excitation.

For example, in some implementations, a high reverse bias may be applied to the p-i-n diode structure to create large electric field across the intrinsic layer of the p-i-n diode structure. Such large electric field facilitates inducing large Stark shift of the defect states needed for achieving tunability of the emission wavelength.

Such large electric field, however, also leads to free carrier depletion in the intrinsic region, as described above. The lack of free carriers under depletion may help reduce spectral diffusion. However, the carrier recapturing process by the defects may correspondingly be missing. As such, the emission efficiency of the defects may decrease due to photo-ionization of the defects to long-lived dark state and some amount of charge instability may be generated as a result of photo-ionization, leading to some amount of spectral diffusion which may be adverse to quantum information processing.

In some implementations, a first optical field may be introduced for charge repumping/resetting to offset the effect of photo-ionization by a second optical excitation used for preparing the defects to generate optical emission (the second optical excitation is discussed in more detail below). For example, an optical field at a particular non-resonant wavelength may be used to repump the defect from the ionized charged dark state into the charge neutral state. As shown by the example below for a divacancy defect in SiC lattice, a wavelength of about 700 nm may be used for optical repumping. Such optical repumping may cause minimum amount or no photo-ionization of the defect. As such, the presence of the first optical field is alternative to and plays a role similar to free carrier recapturing in combating photo-ionization in the defects, under large reverse bias for generating the Stark shift needed for the tunability of the emission wavelength. The added benefit of free carrier depletion is that the spectral diffusion due to presence of free carriers is reduced or removed.

In some implementations, the additional second optical field may be introduced for preparing or exciting the defect to the optically bright excited state such that photons may be emitted from the defects, similar to the optical excitation used in the gated single photon source above. This second optical field may also cause photo-ionization of the defect into charged dark state in addition to preparing the defect into the optically bright excited state. However, due to the presence of the first optical field, the defect may be quickly repumped into charge neutral state. As such, the first optical repumping field effectively improve the emission efficiency and further reduce charge instability in the defects due to photo-ionization. The single photon emission from the defect due the excitation by the second optical field may be spectrally narrow without much spectral diffusion.

The first optical field above may be a combination of optical fields at multiple wavelengths for effective charge repumping with little or no photo-ionization. Likewise, the second optical field above may also be a combination of optical fields at multiple wavelengths for effective preparation and excitation of the defects into the optically bright excited state. The first and second optical fields may be focused to achieve a spatial resolution for spatially addressing single defect in the intrinsic layer of the p-i-n diode structure, using for example, the confocal microscope 238 of FIG. 2.

The electric bias above may be adjusted to achieve wavelength tunability of the optical emission from the defects while free carrier depletion is maintained.

The first optical field and the second optical field may be timed independently. For example, they may be introduced as optical pulses that are in any sequence. They may alternate in time, overlap in time, or may be arranged in any other timing configurations.

c. Spectrally Narrow Single Photon Source

As described above and in more detail below, the p-i-n diode structure of FIG. 2 may be used as a building block for achieving a single photon source with narrow spectral lines by reducing spectral diffusion via operating the diode in depletion regime and using optical charge repumping to reduce additional spectral diffusion caused by photo-ionization. For a single photon source based on the p-i-n diode operated in non-depletion regime, the spectral diffusion that may be caused by photo-ionization may be reduced via free carrier capturing or optical charge repumping.

For example, the diode structure of FIG. 2 may be reverse biased at lower voltage such that free carriers are available in the intrinsic layer of the diode structure for recapturing by the defects. As such, when a single defect is prepared by optical excitation into the optically bright excited state, photons are emitted, and because the charge instability due to photo-ionization may be reduced by free carrier recapturing, the spectral linewidth of the optical emission may be reduced.

Figure 28:
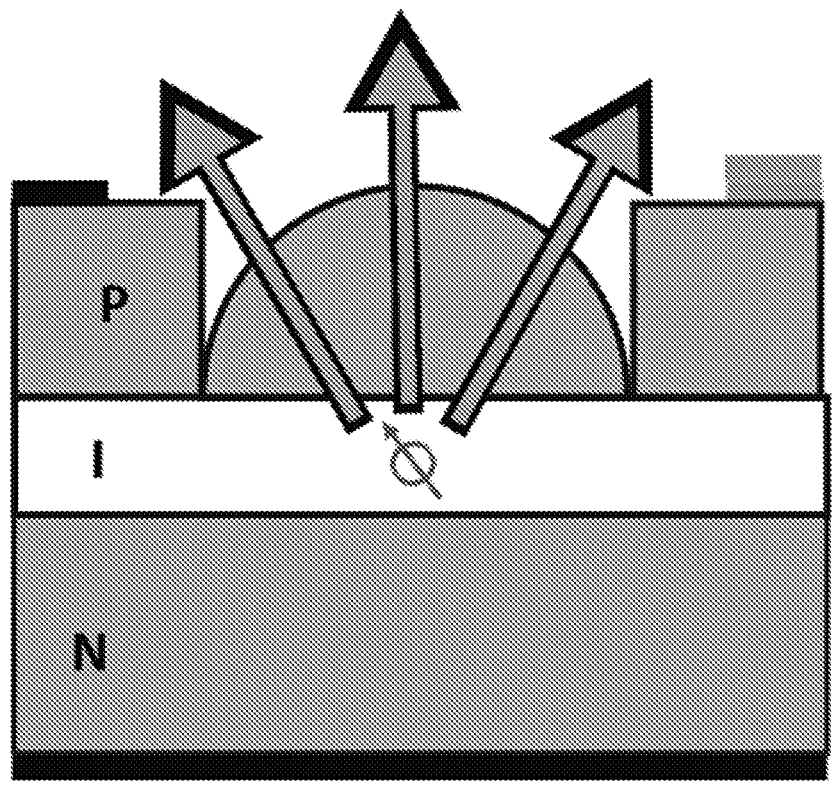
FIG. 28 shows an example implementation for adapting the p-i-n structure into more complex device configuration.

For another example, the diode structure of FIG. 2 may be reverse biased at high reverse voltage such that free carriers are depleted in the intrinsic layer of the diode structure and no free carriers are available for recapturing by the defects. As such, spectral diffusion due to charge instability may be greatly reduced. While there are no free carriers available for charge recapturing and reduction of the spectral diffusion that may be caused by photo-ionization, an alternatively optical charge repumping/resetting may be used to combat the effect of the photo-ionization. Narrow spectral line thus may be achieved under high reverse bias.

d. Integration of the p-i-n Diode Structure into Integrated Devices, and Other Types of Structures In some implementations, the p-i-n diode structure may be integrated into other structures or device geometries. For example, FIG. 28 shows that the p layer may be shaped to facilitate extraction of optical emission from the single defects. FIG. 28 in particular shows that the p layer may be shaped into a ball lens for extraction of optical emission. Other types of structures other than bare p-i-n structure may be used. For example, the device and method implementations may be based on bulk semiconductor having defects, MOSFET structures, transistors, photo detectors such as avalanche photo diodes, photonic bandgap structures, and other forms of stacking of intrinsic or doped homostructures. In addition, any of the example structures above may be based on heterostructures comprising different semiconductor materials.

Figure 29:
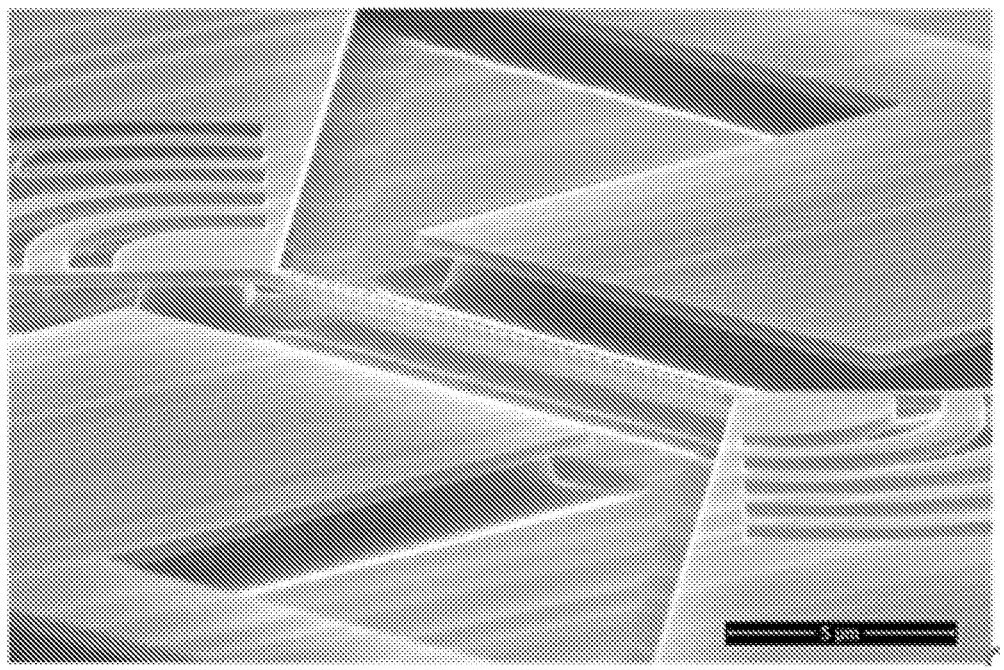
FIG. 29 shows another example implementation for adapting the p-i-n structure into more complex device configuration.

FIG. 29 further shows that the p-i-n diode structure may be embedded into more complex structures such as photonic crystals, mechanical resonators, waveguides, and grating couplers, allowing for in-situ tuning of the defects within these structures and providing narrow emission lines.

The device structures in FIGS. 28 and 29 may be fabricated using photo-electrochemical techniques for selective etching of, for example, the p-type or n-type layer of SiC structures.

Figure 30:
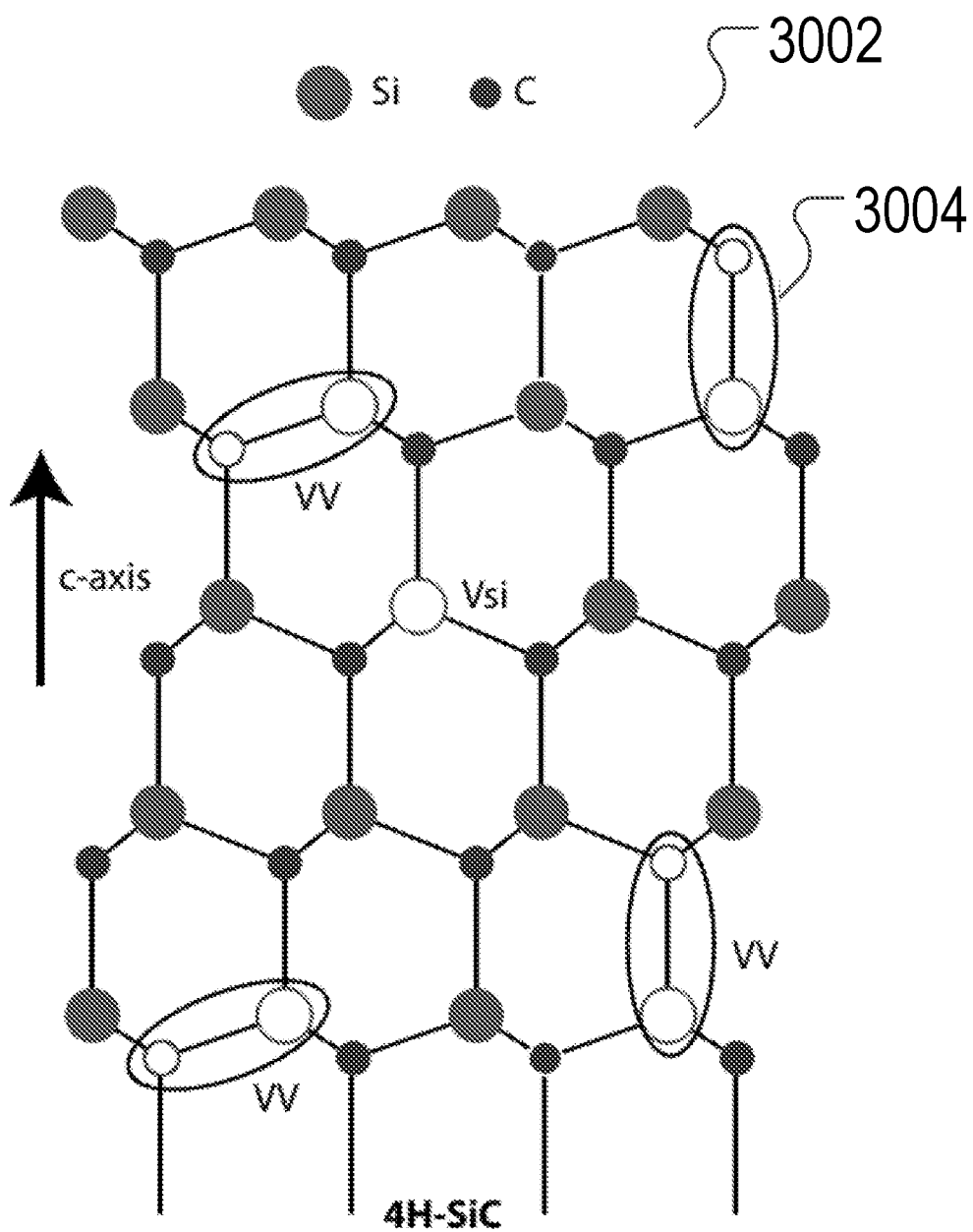
FIG. 30 illustrate an example silicon carbide lattice with silicon-carbon divacancies.

Additional Detailed Implementations a. Semiconductor Homostructures and Isolation of Single Defects Merely as an example, a SiC p-i-n diode containing divacancies (VV, $VV^0$ for example) or silicon vacancies (VSi) is described in more detail below. The SiC host may include a 3C, 4H or 6H silicon carbide lattices (3C—SiC, 4H—SiC, or 6H—SiC). The divacancies, for example, may be produced by carbon implantation into the SiC lattices followed by thermal annealing, or alternatively, by using electron irradiation. The carbon implantation, for example may be carried out in an example implantation energy of 10 Key to 10 MeV, resulting in a carbon dosage in a range of, for example, $10^8$ and $10^{13}$ $cm^{-2}$. The thermal annealing following the carbon implantation may be carried out at a temperature in a range of 600° C. and 1600° C. The thermal annealing may be performed for various durations. For example, the carbon implanted silicon carbide lattices may be annealed for 1 hour, 2 hours, 3 hours, 4 hours, and other durations. The vacancies may provide the optically bright first charge state and the optically dark second charge state. The term "defect" is used interchangeably with the term "impurity". The example of SiC host lattice with divacancies are illustrated in 3002 of FIG. 30 and is further described in the International PCT Patent Application No. PCT/US19/17817, which is herein incorporated by reference in its entirety. The silicon-carbon divacancies are shown by 3004.

For a particular example, custom grown wafers containing intrinsically doped epilayers may contain low enough defect density to isolate sparse single defects through confocal microscopy. After growth, 2 MeV electron irradiation at a dose of, e.g., $1e10^{12}$-$1e^{15}$ $cm^{-2}$ may introduce vacancies in the lattice, that upon annealing (850 C, 30 minutes), form VV0 and other defect complexes and traps. Specifically, an n-type substrate SiC wafers (n=1e18-1e19 $cm^{-3}$) with 10 um i-type (n<1e15 cm$^{-3}$, Vc~1e15 cm$^{-3}$) and 400 nm p-type (Al doping of 7e18 cm') epilayers grown on top, creating a vertical p-i-n homojunction. After forming isolated VV$^0$ in these wafers, ohmic contact is made uniformly on the back n-type surface using ~300 nm of NiCr (80/20). This n-type contact is made ohmic using a 5 minute RTA anneal in Ar ambient at 950 C. Subsequently, lithographically patterned ohmic contact is made to the top p-type layer (30 nm Ti, 100 nm Al, 30 nm Au). The top contact is made ohmic by annealing anneal in a quartz tube furnace in Ar at 850 C for 10 minutes. These patterned structures allow for optical access of the defects. Ohmic contact is confirmed through linearity of the IV response between two pads on the same layer for both the top and bottom contact. After top and bottom contact formation, nearby microwave striplines are fabricated (10 nm Ti, 150 nm Au), allowing microwave coherent control of the spins in the defects. Other dopants for the n and p-type layers may be used. Such dopants may include but are not limited to aluminum or boron for the p-type and nitrogen or phosphorus as the n-type.

Other material system (other than SiC) providing similar charge states and charge conversion characteristics may also be used. These example material systems include but are not limited to silicon, YSiO, zinc oxide (ZnO), lithium niobate (LiNbO3, having a bandgap ~4 eV), quartz (having a bandgap >6 eV), aluminum nitride (AlN, having a bandgap of ~6 eV), gallium arsenide (GaAs, having a bandgap ~1.4 eV), diamond (having a bandgap ~5 eV), and 2D materials such as Hexagonal boron nitride (HBN) and molybdenum disulfide (MoS$_2$).

Defects in the different types of SiC crystal or other material systems may include but are not limited to silicon vacancies (Vsi), divacancies (VVs), carbon antisite vacancies (CAVs), Silicon Antisites, nitrogen vacancies (NVs), transition metal complexes (such as Cr, V, Mo), rare earth centers (such as Er, Nd, Yb centers). In some implementations, these defects may be spatially isolated in the host crystal lattice. Defects may be naturally present in the as-grown semiconductor host crystal. Defects may be created by electron radiation or ion-implantation. For example, defects may be generated by carbon implantation. The implantation may be performed at the conditions described above. Ion implantation may be performed under other suitable conditions.

An example SiC p-i-n diodes are created through custom commercial growth of doped epilayers. After growth, electron irradiation and subsequent annealing create single VV$^0$ defects. The electrodes (226 and 224 of FIG. 2) are fabricated allowing for electric bias and gating. Other contacts, such as the microwave stripline 240 on an insulating layer as in the illustrated example may also be fabricated, for applying RF signals for manipulation of spin states of the defects. In contrast to other defects in SiC such as the isolated silicon vacancy, the divacancy is stable above 1600° C. making it compatible with device processing and high temperature annealing to form ohmic contacts.

Using a confocal microscope 228 of FIG. 2, spatial photoluminescence (PL) scans of the p-i-n device (hereinafter referred to as the device) with no applied bias may be performed. The confocal microscope, for example, may have an example magnification of 100, and have near-IR objective with an example numerical aperture of 0.85. The optical emission may be collected by the confocal microscope and then using an optical fiber (such as a 1060XP fiber). The optical emission may be detected by a photo detector, such as a Quantum Optus commercial SNSPD.

Figure 6:
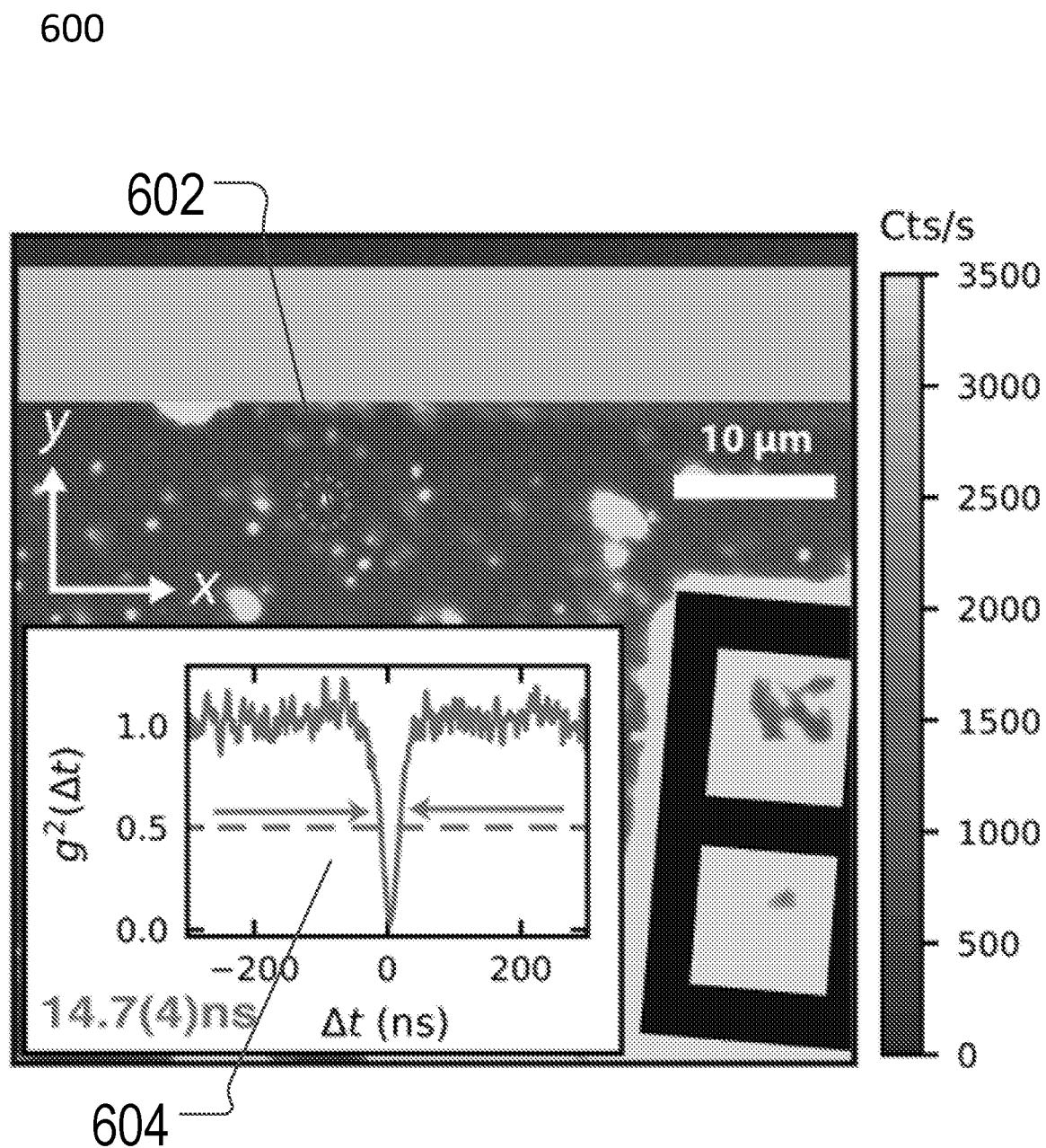
FIG. 6 illustrates detection of emission from single spatially isolated defect in the intrinsic layer of the p-i-n diode structure.
Figure 7:
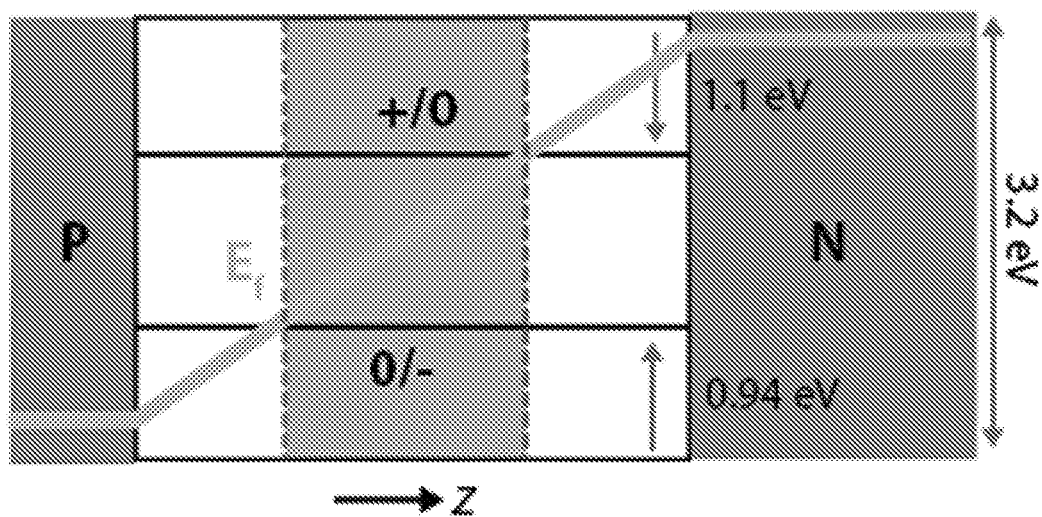
FIG. 7 illustrates Fermi levels and charge transition levels in the p-i-n diode structure.

As illustrated in FIG. 6, the spatial PL scan shows isolated bright spots, such as 602, corresponding to single VV$^0$. By performing a second order correlation (g$^{(2)}$) measurement shown in the insert 604 of FIG. 6, the single emitter nature of these bright spots may be confirmed. The depth dependence of the observed defects may be measured and is consistent with them being isolated to the intrinsic layer, as expected from the Fermi level and formation energy calculations illustrated in FIG. 7. This depth localization provides an alternative to delta-doping, which is not possible with intrinsic defects, facilitating nanoscale positioning in fabricated devices. In these SiC based structures, PL1 (hh), PL2 (kk) and PL4 (kh) divacancies are observed.

Figure 8:
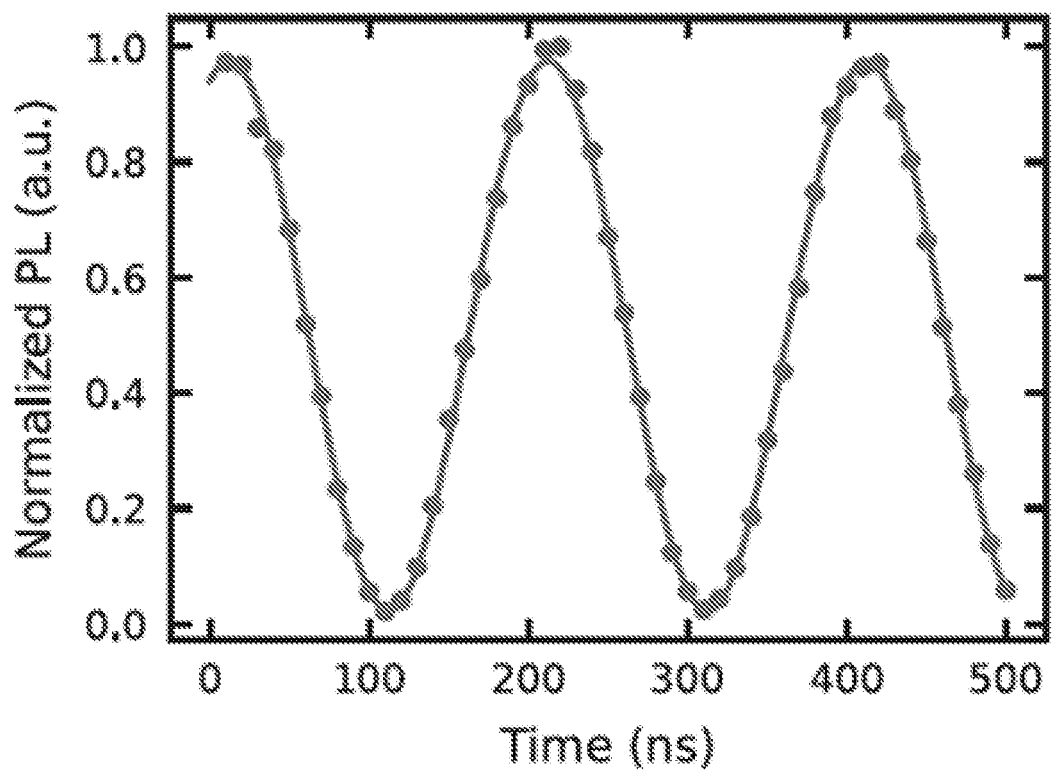
FIG. 8 shows optically detected Rabi oscillation of photoluminescence from a single $VV^0$.
Figure 9:
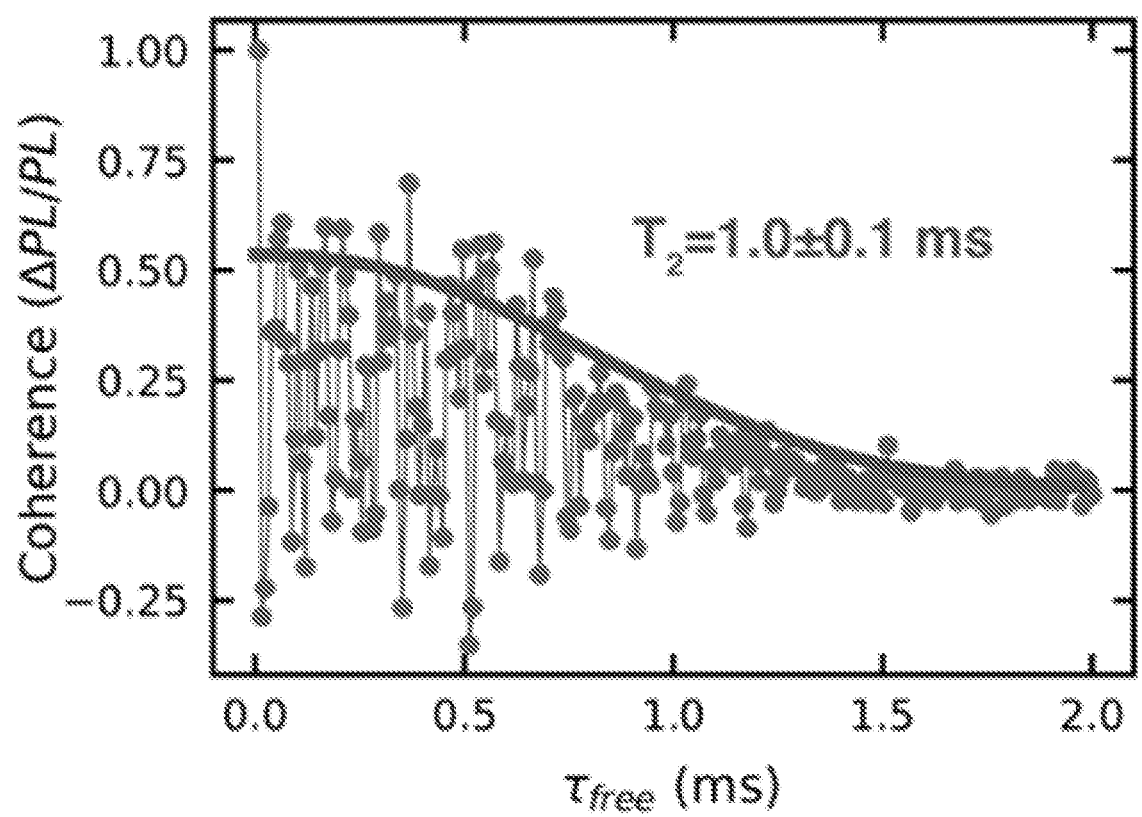
FIG. 9 shows example Hahn-echo measurements indicating a long spin coherence in a single defect and that the spin coherence is not affected by the integration of the single defect into the p-i-n structure.

Resonant preparation of and readout from the single VV$^0$ defect may be further implemented, as shown by the high contrast Rabi oscillations of single VV$^0$ isolated in the p-i-n homostructure in FIG. 8. Additionally, a single spin Hahn-echo decay time of 1.2 ms is measured for spins in the device, as shown in FIG. 9 (where the spin Hahn-echo oscillation decays at a long time scale of 1.2 ms). The long Hahn-echo times and coherent control demonstrate that integration into homostructures does not degrade the spin properties of VV$^0$.

b. Charge Gating and Photo-Dynamics of Single Defects

Figure 10:
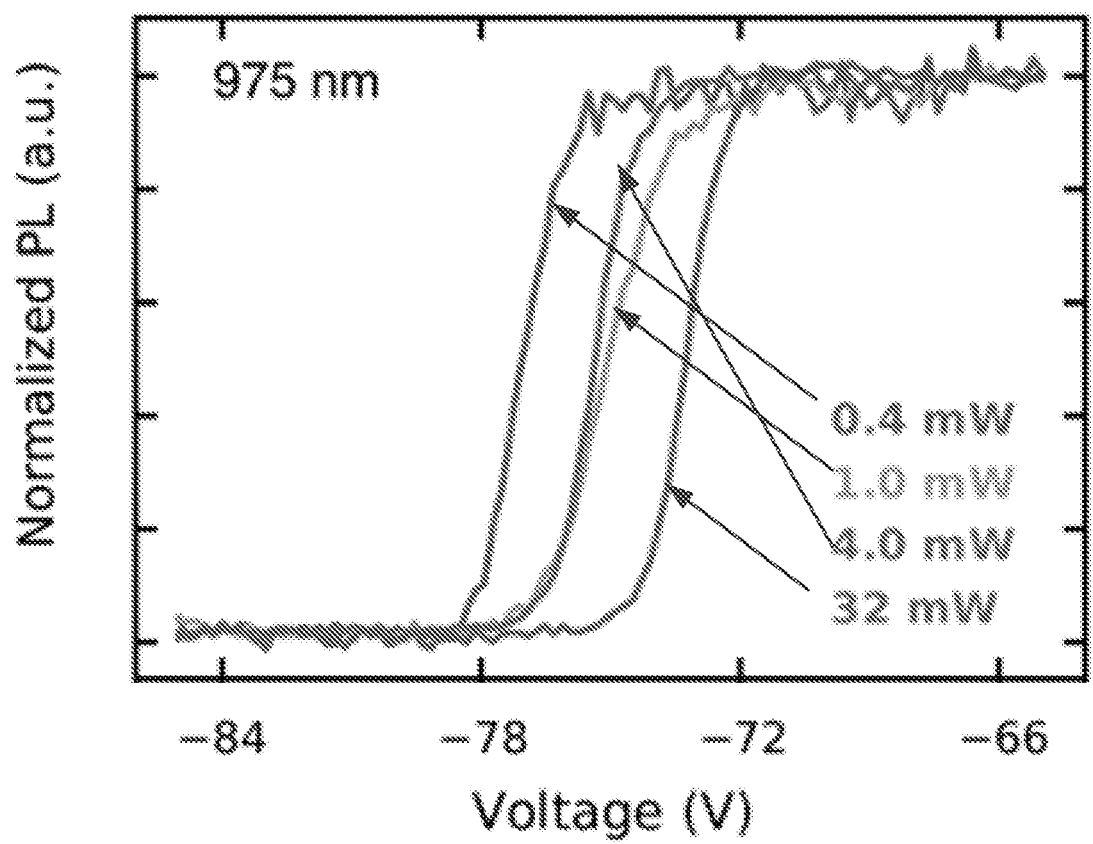
FIG. 10 illustrates photoluminescence switching in a single defect by applying reverse bias to the p-i-n structure under an off-resonant optical excitation as a function of excitation power.
Figure 11:
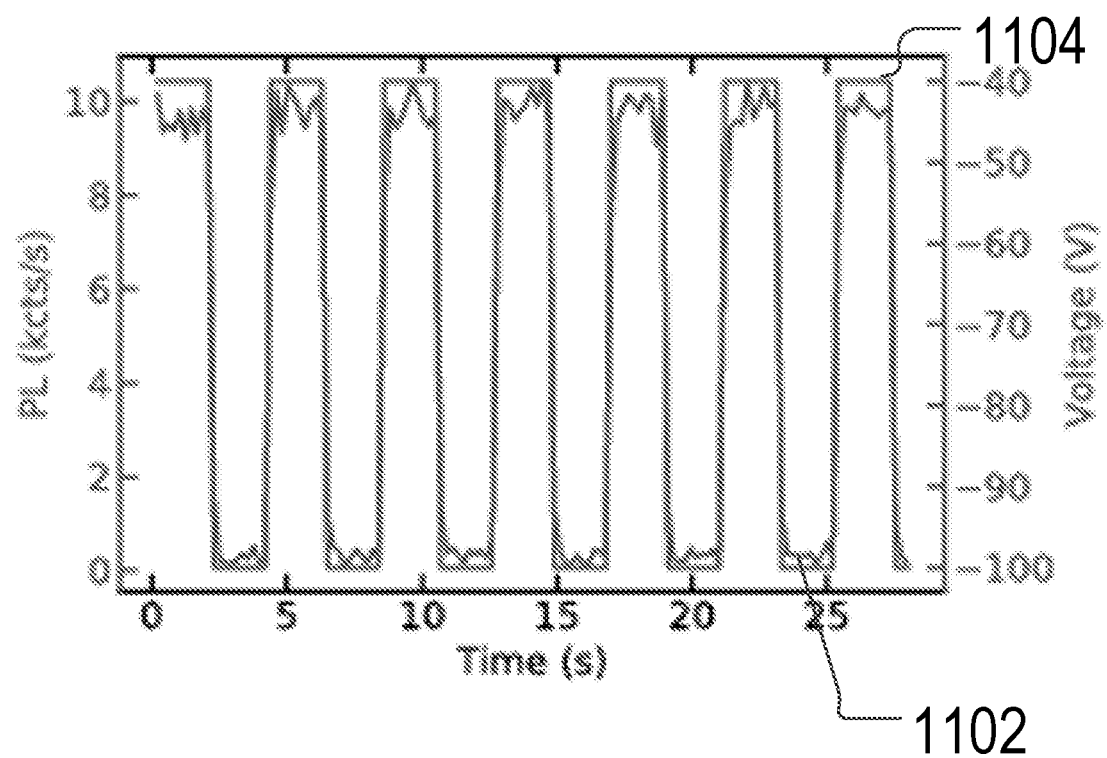
FIG. 11 demonstrates photoemission switching by gating the reverse bias between a high bias value and low bias value.

Upon applying bias voltage to the device, the stability of defects under reverse and forward bias may be evaluated. Under illumination with 975 nm off-resonant light, the PL drops dramatically once a threshold voltage is reached, as shown in FIG. 10. This voltage threshold varies between defects, as a result of differences in their position compared to the top gate, their relative depth in the intrinsic region, and changes in local charge trap density (as such, the variation of voltage threshold may be used as a basis for detecting depth of the defects). As described above, the PL reduction at high bias voltage to photo-ionization to a dark charge state with in sufficient free carrier (due to depletion) for recapturing. An electrically gated single photon source may be created, as discussed above. In particular, the emission of photons is modulated in time with a gate voltage, as shown in FIG. 11, where modulation speeds up to MHz or more may be achieved. In particular, FIG. 11 shows the on-off switching of the photoemission as the bias voltage is alternated between a first high value 1102 and a second low value 1104, where the first high value is higher that a first threshold bias value and the second low value is lower than a second threshold bias value. The threshold voltage may exhibit a slight hysteresis and laser power dependence, as shown in FIG. 10, suggesting that trapped charges may play a role.

A possible explanation for the voltage dependent PL of FIG. 10 is that at low reverse bias, the optical illumination constantly photo-ionizes the VV$^0$ and other nearby traps. However, the single divacancy can rapidly capture available free carriers returning the defect to the neutral charge state. Under high enough reverse bias, carrier drift depletes the illuminated region of free charges (shown in FIG. 4). Thus, when a VV$^0$ photo-ionization event occurs no charges are available for fast recapture, resulting in a long lived dark state.

Figure 12:
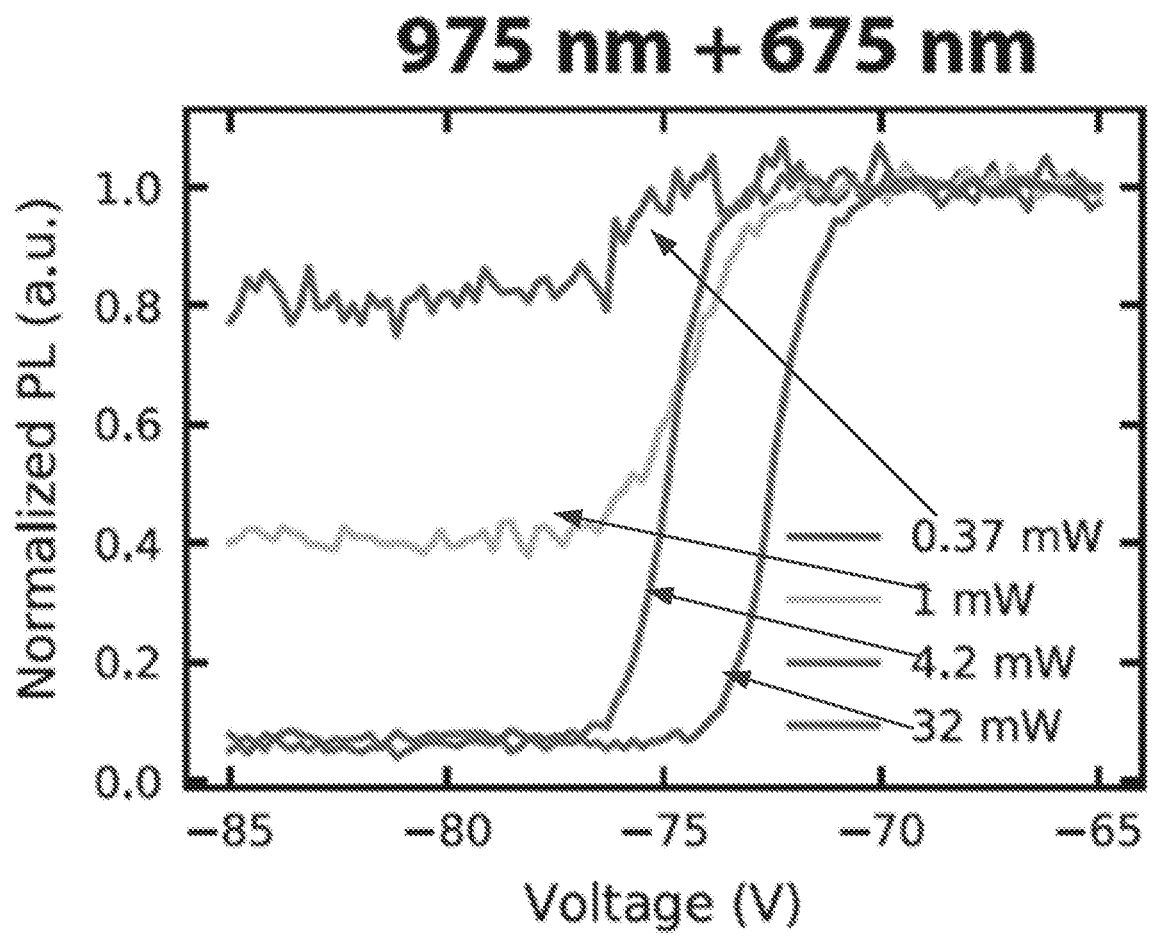
FIG. 12 illustrates photoluminescence switching in a single defect by applying reverse bias to the p-i-n structure under both an off-resonant optical excitation of various powers and a charge repumping optical excitation of a predetermined power.
Figure 13:
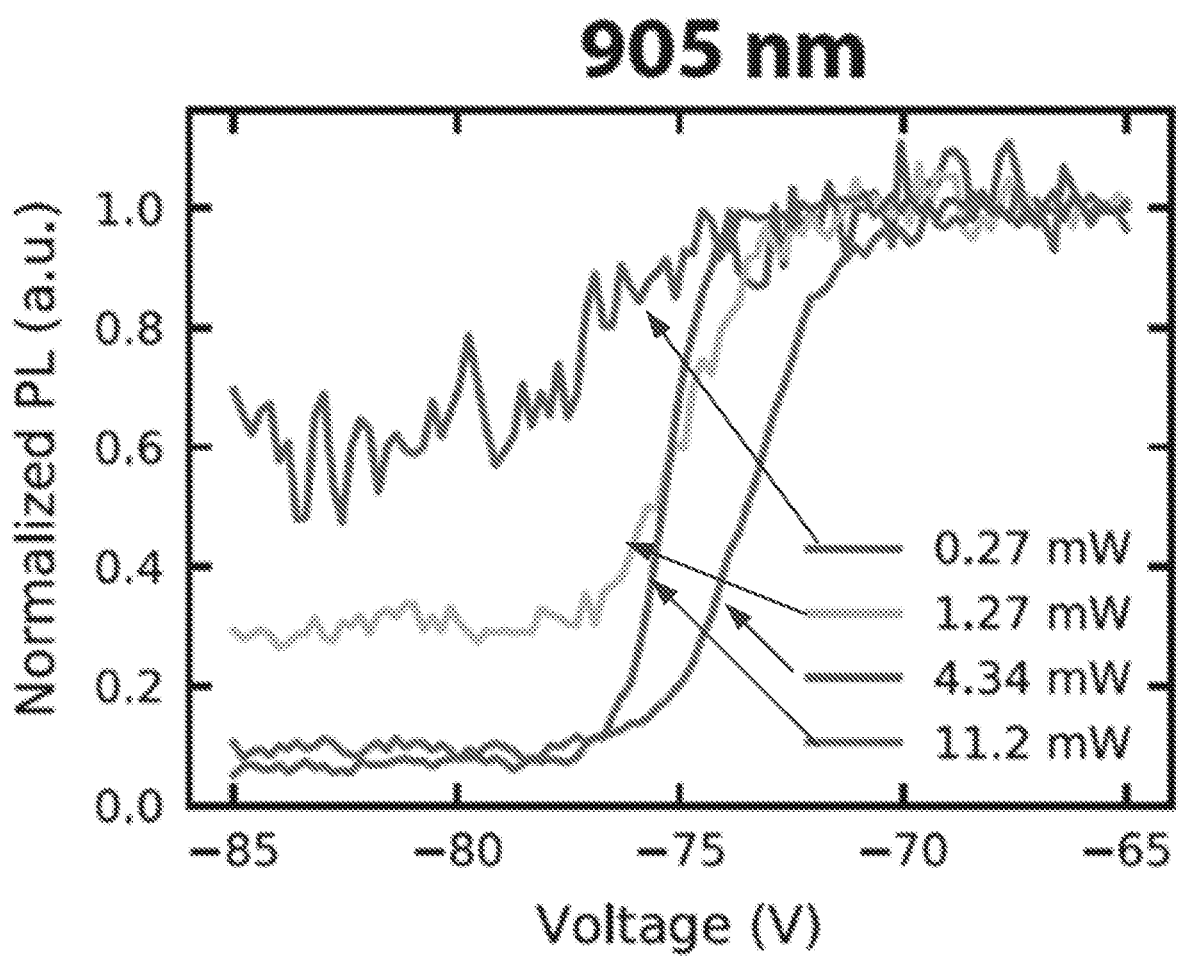
FIG. 13 illustrates photoluminescence switching in a single defect by applying reverse bias to the p-i-n structure under an optical excitation at various excitation power and with a wavelength between the off-resonant optical excitation of FIG. 11 and the charge repumping optical excitation of FIG. 12.

FIGS. 12 and 13 show that PL can be enhanced by optically repumping the charge with higher energy laser colors. Under resonant illumination, it may be observed that the PL quickly drops to zero and does not recover, indicating that while the 1131 nm light (resonant with the ZPL of a PL2 VV$^0$) ionizes the defect, it does not reset the charge state even on very long timescales. By applying higher energy repumping light (e.g., 675 nm), while resonant ionization is still present, the charge can be stabilized to a bright state even with <1 nW of applied repumping power, as shown in FIG. 12, where the repumping lower is fixed at a low power. These implementations are run with a rapidly interleaved pulse sequence where the resonant and repumping laser pulses are preferably not on at the same time to avoid multi-photon interplay between the two lasers. A constant microwave drive may be applied to prevent initialization into a dark spin state. This microwave drive is fast enough to not interfere with the slow ionization dynamics.

FIG. 13 shows PL emission as a function of bias under different excitation power at 905 nm, which is in between the repumping wavelength 675 nm and near resonant excitation at 975 nm. Such excitation causes both photo-ionization and charge repumping.

Figure 14:
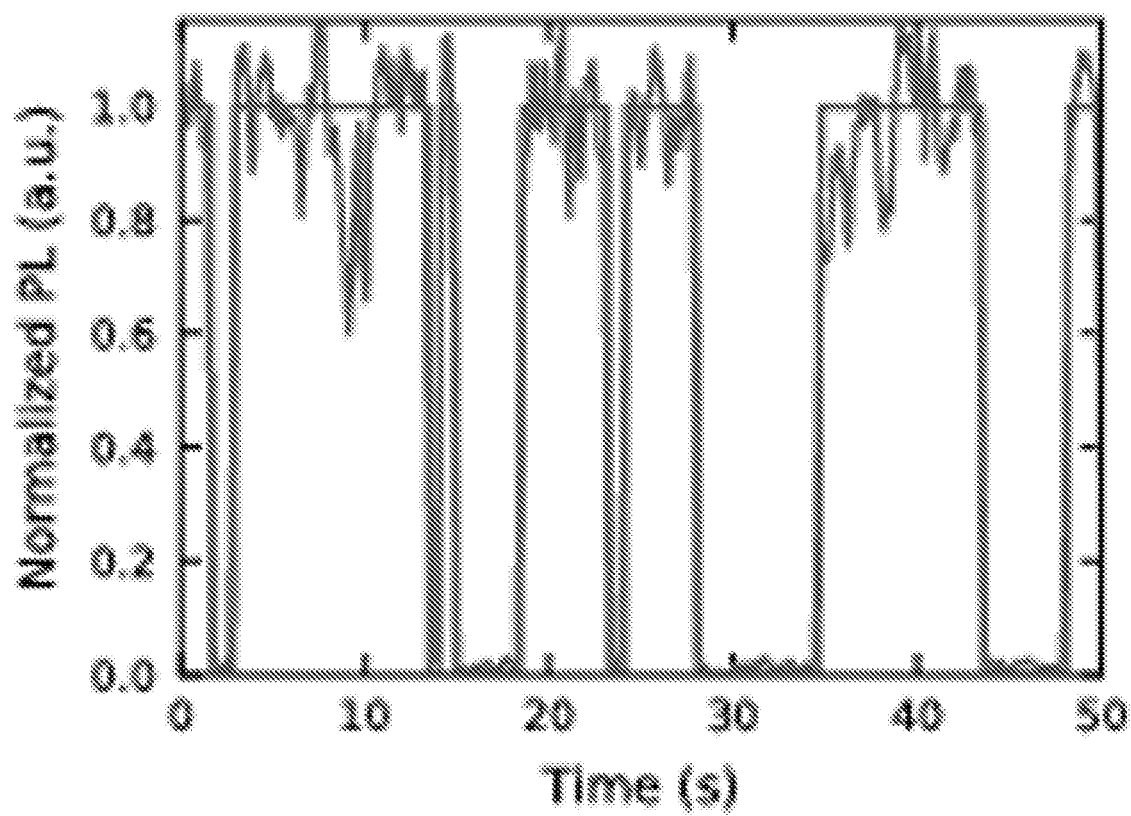
FIG. 14 illustrates blinking of photoluminescence from a single defect due to charge instability.
Figure 15:
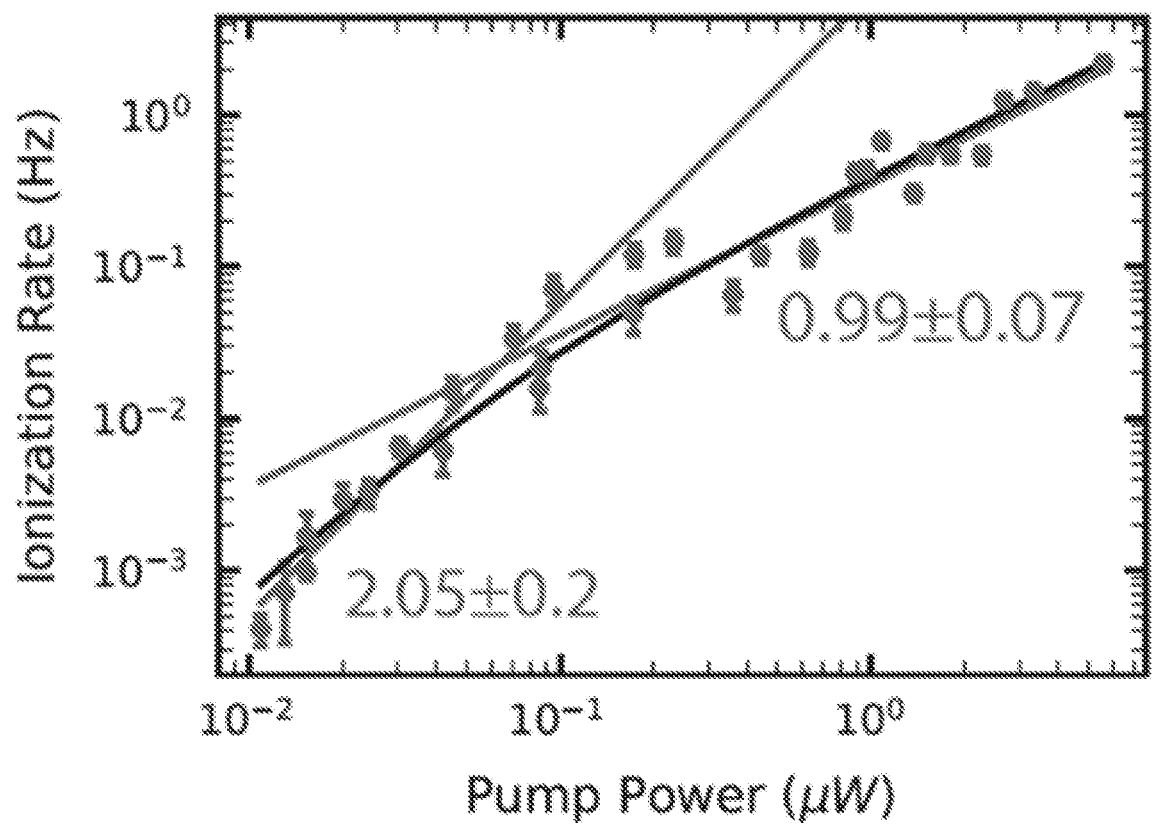
FIG. 15 shows example photo ionization rate of the single defect by resonant excitation as a function of the excitation power.
Figure 16:
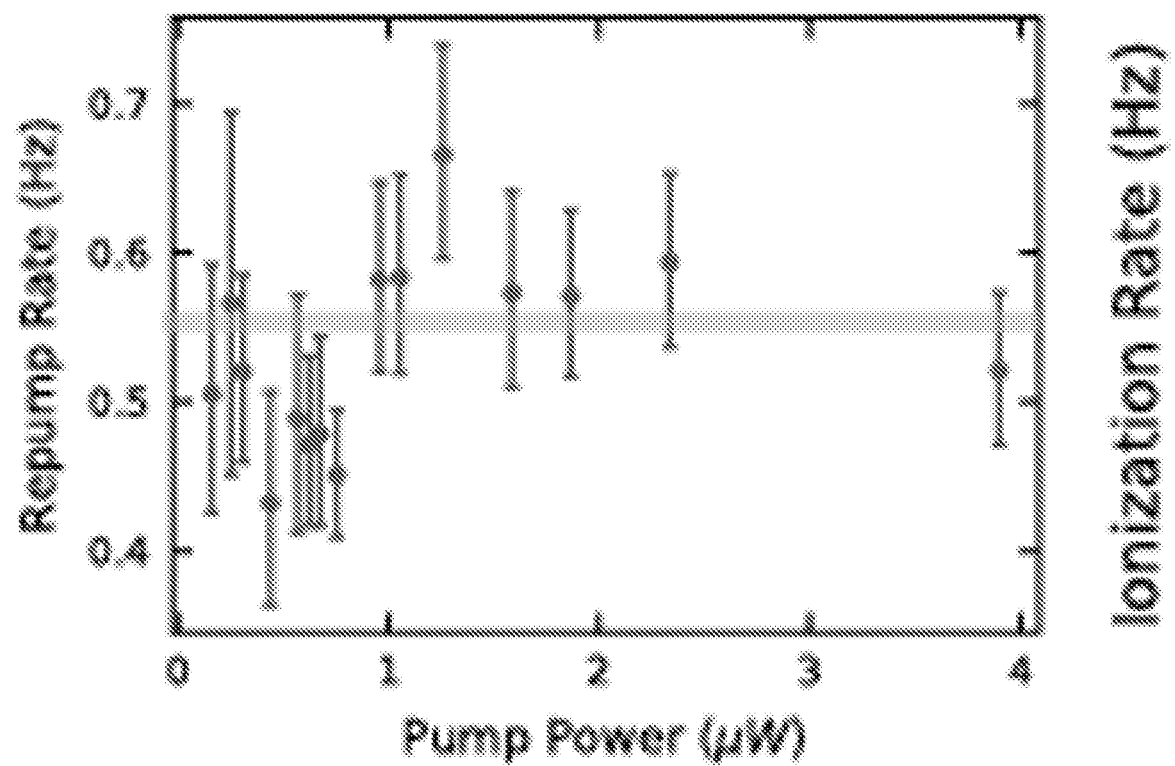
FIG. 16 illustrates an independence of the charge repumping of the single defect as a function of the resonant excitation power, showing that the resonant excitation does not repump.

Charge fluctuation in the defects may cause blinking effect, as shown in FIG. 14. Such blinking dynamics may be used to extract photo-ionization and repumping rates of the defect, where the average bright and dark times represent the inverse of the ionization and reset rates respectively. Examination of the ionization rate of a single $VV^0$ by resonant excitation is shown in FIG. 15. FIG. 15 shows that under resonant excitation, the photo ionization power dependence is quadratic below defect saturation (exponent 2.05±0.2) and linear at higher powers (exponent 0.99±0.07). This is consistent with a two-photon process including a linear absorption event that can saturate and a one-photon ionization from the excited state to an ionized defect. The observed charge repump rate by the resonant excitation, however, is not found to change with resonant illumination intensity, as shown in FIG. 16. As a result of such characteristics, the charge state may be deterministically controlled with light.

Figure 17:
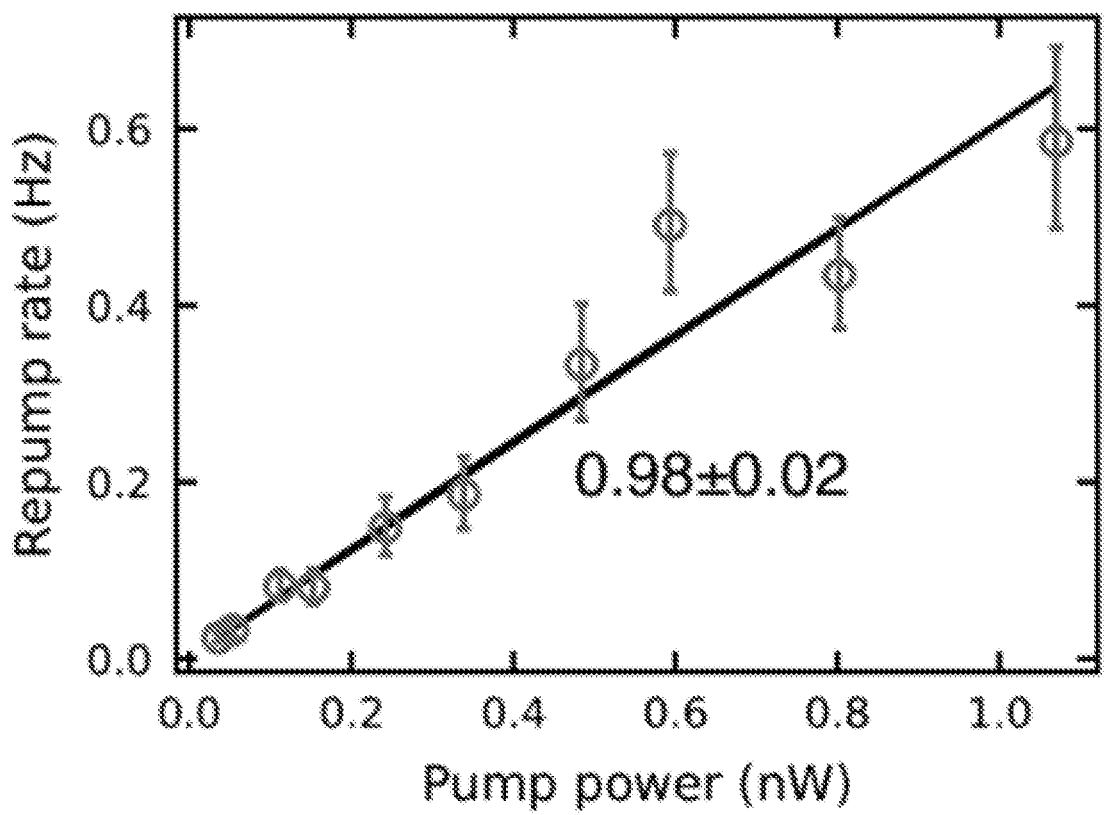
FIG. 17 shows example charge repumping rate of the single defect by non-resonant charge repumping/resetting excitation at 688 nm as a function of the excitation power.

The reset laser kinetics may be similarly evaluated by varying the power of the repumping laser. FIG. 17 shows a near linear power law with an exponent of 0.98±0.05, under repumping wavelength of 688 nm. This linear dependence of repumping rate can be described in two ways. One possibility is that the dark charge state is directly one-photon ionized by the 688 nm laser. The other is that nearby traps are photo-ionized by this color and the freed charges are captured by the divacancy to convert back to the bright state. These ionization and charge reset process are illustrated by the energy diagrams and various electronic transitions illustrated in FIG. 18. Further, the observed charge photo ionization rate for the reset laser is not found to change with charge repumping laser illumination intensity, as shown in FIG. 19. Combined with the results that the non-resonant repump laser does not cause significant ionization, and that the resonant laser does not reset the charge, full deterministic control of the charge state of the single defect is possible.

Figure 20:
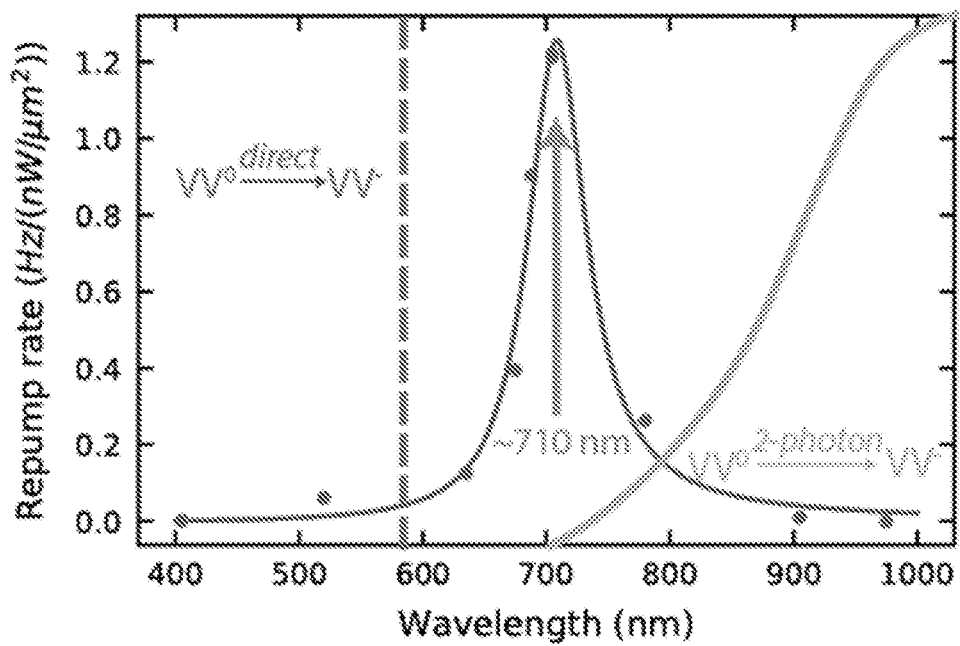
FIG. 20 shows charge repumping rate and photo-ionization rate for an optical excitation of a predetermined power as a function of wavelength.

By varying the color of the reset laser, the mechanism as well as optimization of the repumping process may be achieved. For the same power, the rates in the photo-dynamics are drastically different for each color. Each laser excitation color both adds to an unwanted ionization rate and spectral diffusion of $VV^0$ and resets the spin's charge state at varying speeds per unit power, as shown in FIG. 20. With a given illumination intensity, different colors broaden the PLE lines significantly and reduce the integrated intensity, representing fast ionization, as shown in FIGS. 21 and 22.

In one implementation, an optimum wavelength around 700 nm for the charge reset may be identified, suggesting that a particular trap state energy or a possible defect absorption resonance behind the charge resetting. As shown in FIGS. 20 and 21, excitation around 700 nm add little ionization and broadening to the PLE lines, while higher energy illumination such as 520 nm was found to greatly increase the added ionization rate, consistent with a direct ionization process predicted through defect formation energies. In ensembles of defects, ~905 nm off-resonant light was found to be optimal in producing PL, as that wavelength both excites the defect and repumps the charge state. Those dynamics apply in a single defect, where 905 nm adds a small amount of repumping, while the 975 nm laser bleaches the defect without recovery. However, 905 nm excitation also increases the ionization rate and is much less efficient than red laser colors around 700 nm in resetting the charge. In addition, due to the higher powers necessary to stabilize the charge, 905 nm similarly adds to spectral diffusion of the PLE lines resulting in a broadening, as shown in FIG. 21.

Figure 21:
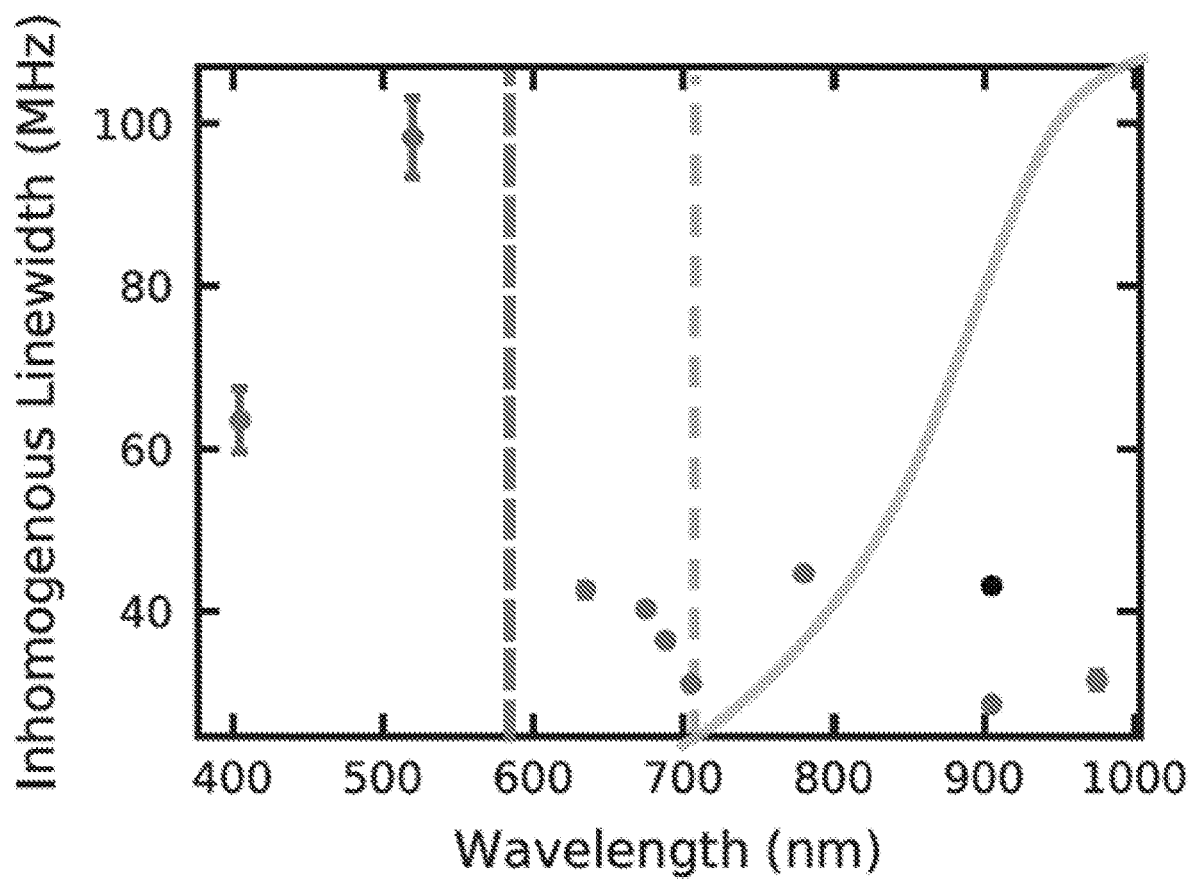
FIG. 21 shows example photoluminescence excitation linewidth and intensity as a function of the excitation wavelength.
Figure 22:
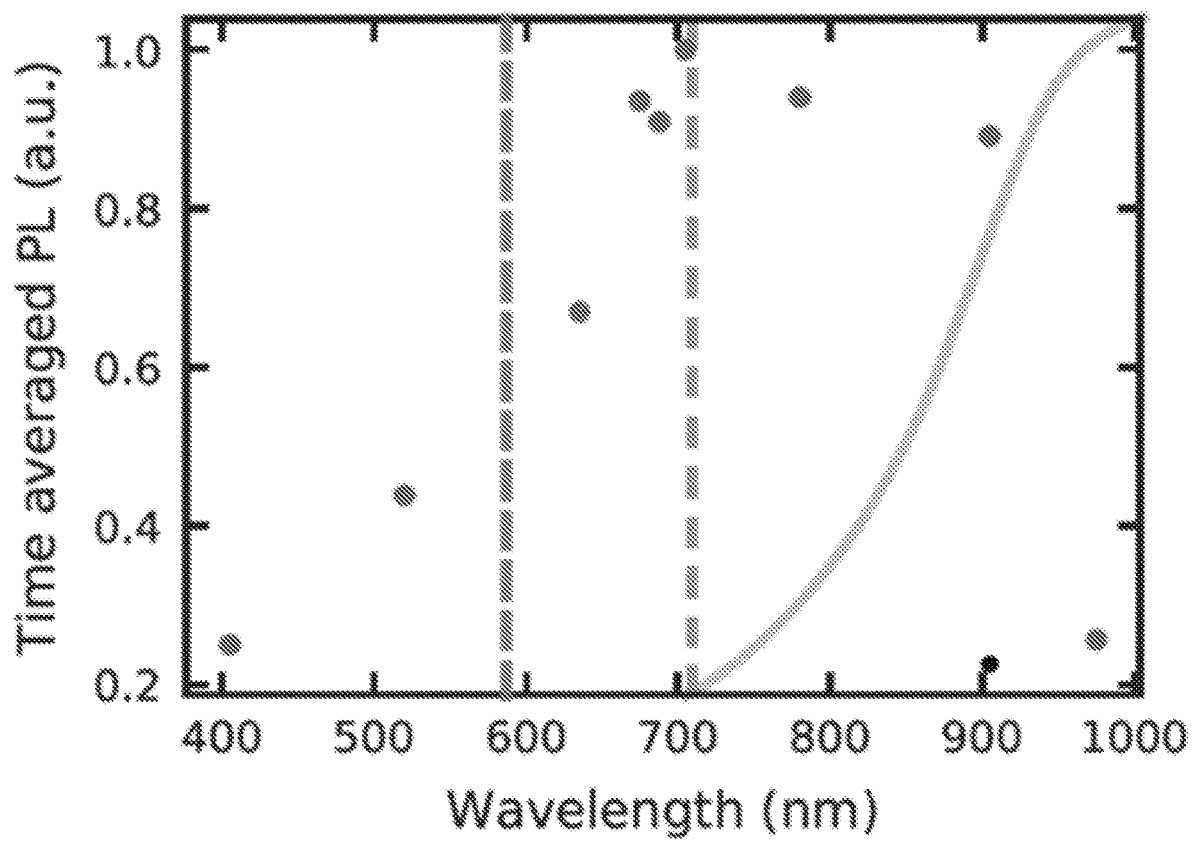
FIG. 22 shows integrated PL intensity under same excitation power at different wavelengths.

In particular, FIG. 21 shows repumping rate of dark divacancy charge state into $VV^0$ with varying illumination wavelength. FIG. 22 shows integrated emission intensity under same excitation power at different wavelength. In the example shown in FIGS. 21 and 22, the black points are for a 905 nm laser power equivalent for the repumping rate provided by a 705 nm dataset. The bias is at reverse 215V where the lines may be narrowest. The orange lines are guides to the eye for the optimum from the Lorentzian fit in FIG. 20.

Figure 18:
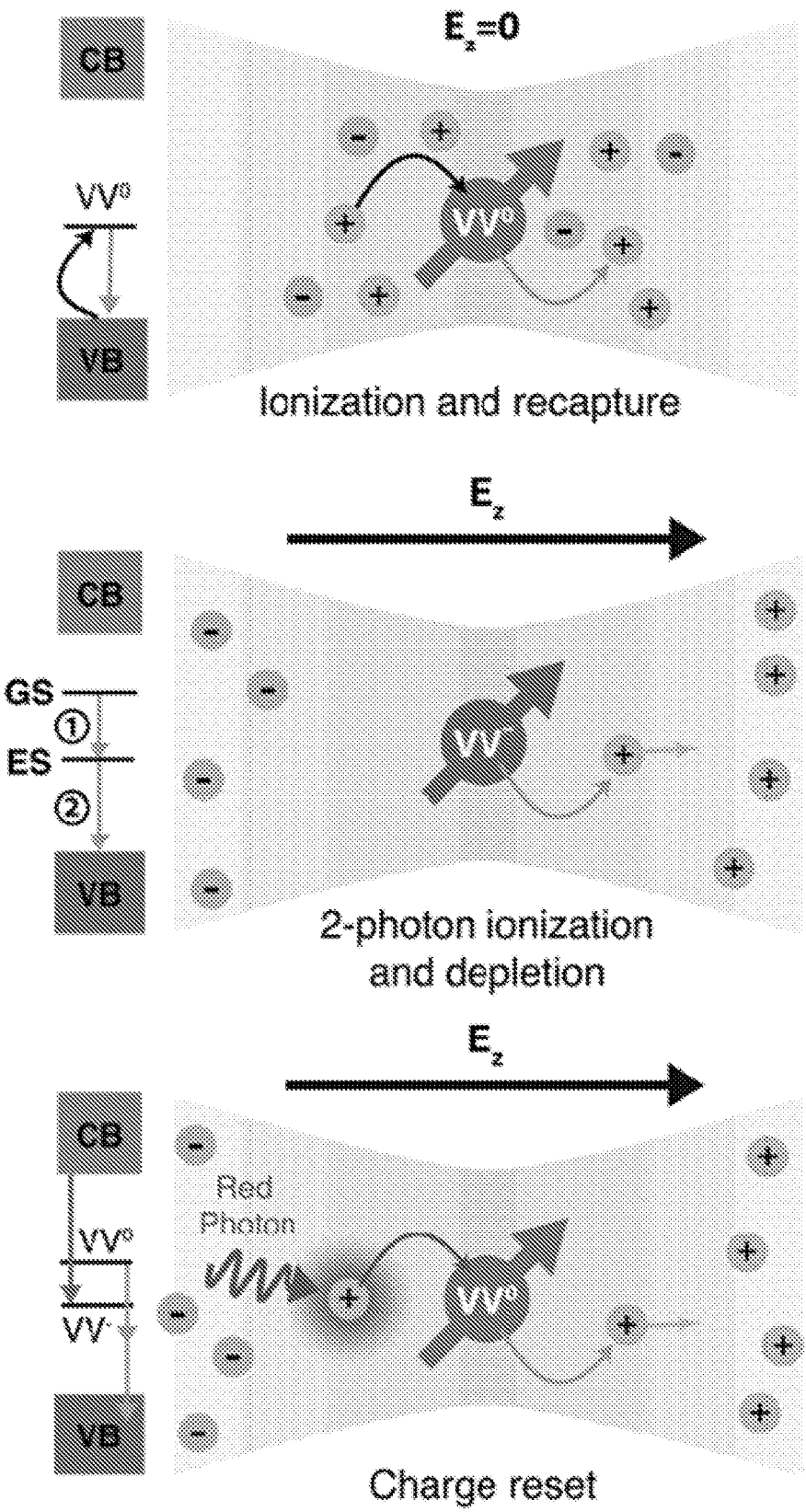
FIG. 18 illustrates a photo ionization and charge repumping/resetting model for the single defect.
Figure 19:
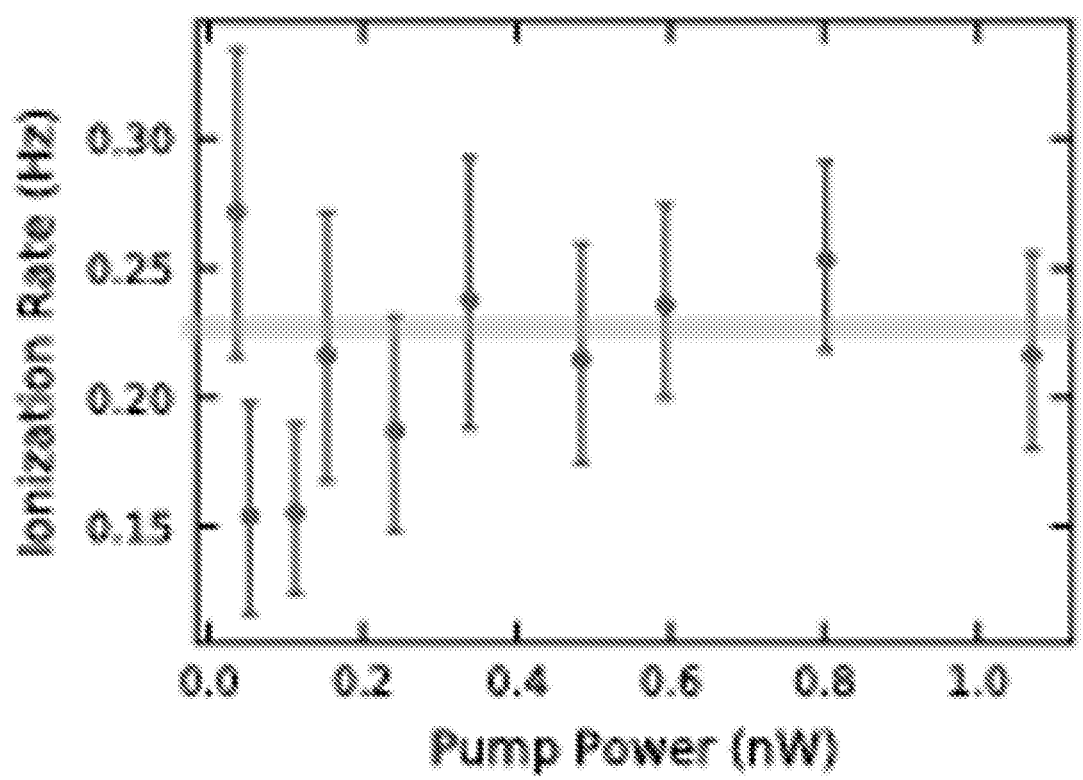
FIG. 19 shows example photo ionization rate of the single defect by non-resonant charge repumping/resetting excitation as a function of the excitation power, showing that the repump does not contribute to ionization.

Returning to the model shown in FIG. 18, with a short repumping pulse the charge can be deterministically reset at the beginning of every experimental sequence. From the power dependence in FIGS. 10, 12, 13, 15-17, and 19, the ionization and absorption cross sections for the relevant lasers used for spin polarization may be estimated, as shown in FIG. 23. In general, the ionization cross section is similar between 975 nm and 905 nm, but is significantly lower for resonant light. Combined with the large absorption cross section of FIG. 23, resonant light is preferred to reduce two-photon ionization, as the needed optical power to reach saturation is much lower. Furthermore, the repumping cross section for 705 nm illumination is over 100× more efficient that the alternate around 905 nm, as shown in FIG. 23. Therefore, high fidelity control under electric fields are carried out with a short charge reset with 705 nm, by first optical pumping into the A1 line followed by control and readout. This sequence may be used for the demonstration of high contrast Rabi oscillations under high electric field, as shown in FIG. 8. The full control sequence stabilizes the charge and reduces ionization and blinking, enabling high fidelity single shot readout and entanglement for quantum information processing.

c. Stark Shift

The charge dynamics described above allows for large electric fields to be applied without permanent ionization. Additionally, the geometry of the p-i-n diode device enables large on-axis electric fields. Since, for example, the (hh) and (kk) divacancies in SiC are nominally symmetric along the c-axis (growth axis, z direction in 230 of FIG. 2), the applied field in the diode mostly conserves the symmetry of the defect.

Therefore, wide tuning of the $VV^0$ optical structure is possible, while reducing unwanted mixing from transverse or symmetry-breaking components of the excited state Hamiltonian. Because the intrinsic region of the p-i-n diode device can be relatively thin, the applied voltage is dropped over a much smaller region than if a bulk sample was used, leading to greatly increased shifts per applied voltage. This region in principle can be reduced to a thickness that exceeds limitations with optical access from small gate sizes, allowing for extreme Stark shifts at relatively low voltages.

In some implementations, reverse bias up to an example value of −420V may be applied across the p layer and the n layer. Stark tuning of several hundreds of GHz on different defects (PL1, PL2 and PL4, corresponding to hh, kk, and kh divacancies, respectively) may be achieved. For example, the shift may be between 0.5-3.5 GHz/V for different defects of the same type and on inequivalent lattice sites after a threshold voltage is passed such that electric field is applied to the single defect (FIG. 4, and described in more detail below). For example, a PL1 (hh) defect with a shift of more than 850 GHz at −420V and a PL4 (kh) defect with a shift of more than 760 GHz at −210 V may be observed. Due to the high dielectric breakdown field of SiC, shifts of a few THz may be achieved. The high field limit of these shifts correspond to an estimated on-axis dipole moment $d_{||}$ of 11 GHz m/MV for hh divacancies and 4.5 GHz m/MV for kk divacancies, respectively. For the (kh) basal divacancy observed, the estimated dipole moment is around d=35 GHz m/MV.

Figure 24:
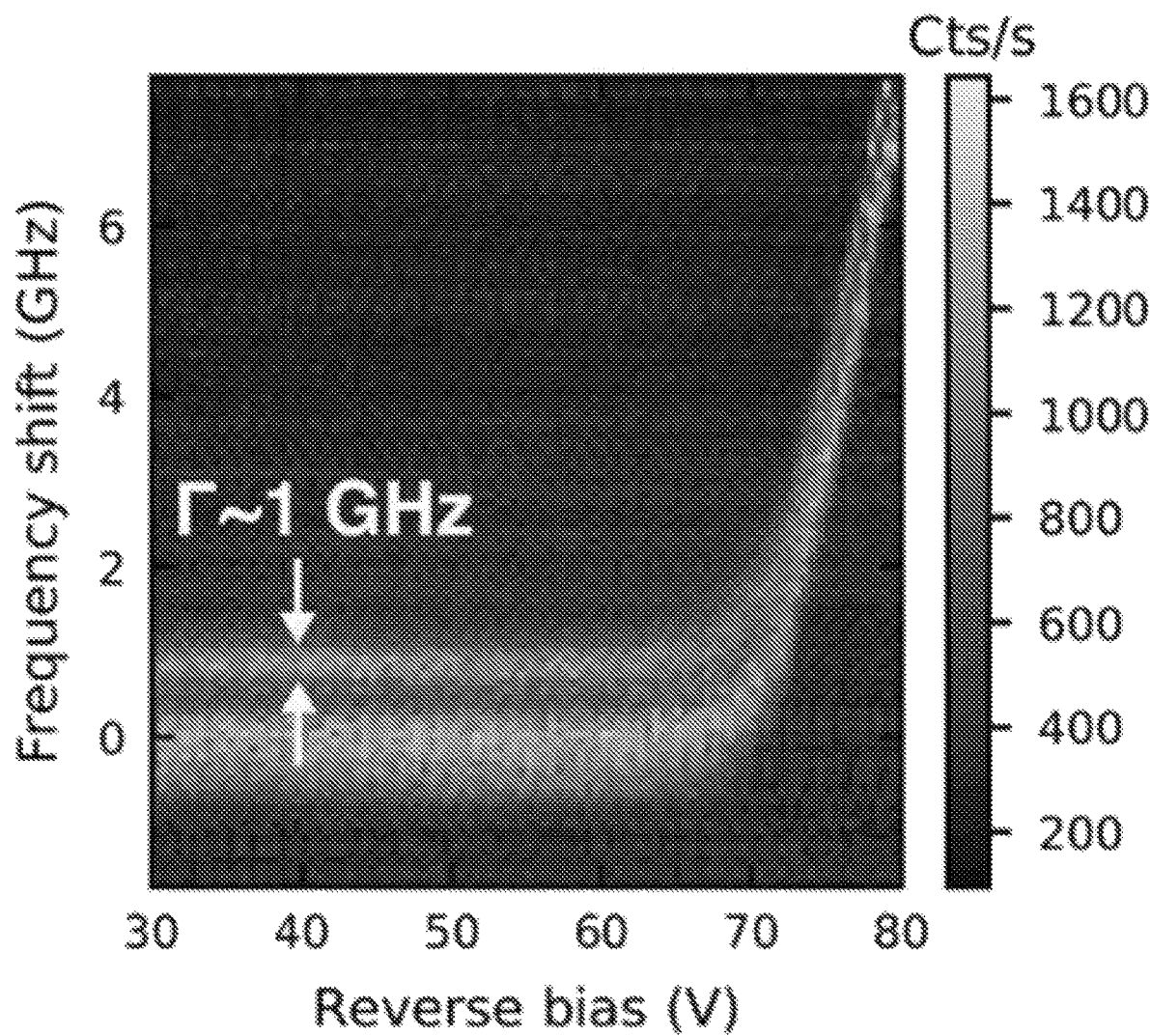
FIG. 24 shows low-field Stark tuning of a single PL2 defect showing a turn-on behavior for the Stark shift above a bias threshold.
Figure 25:
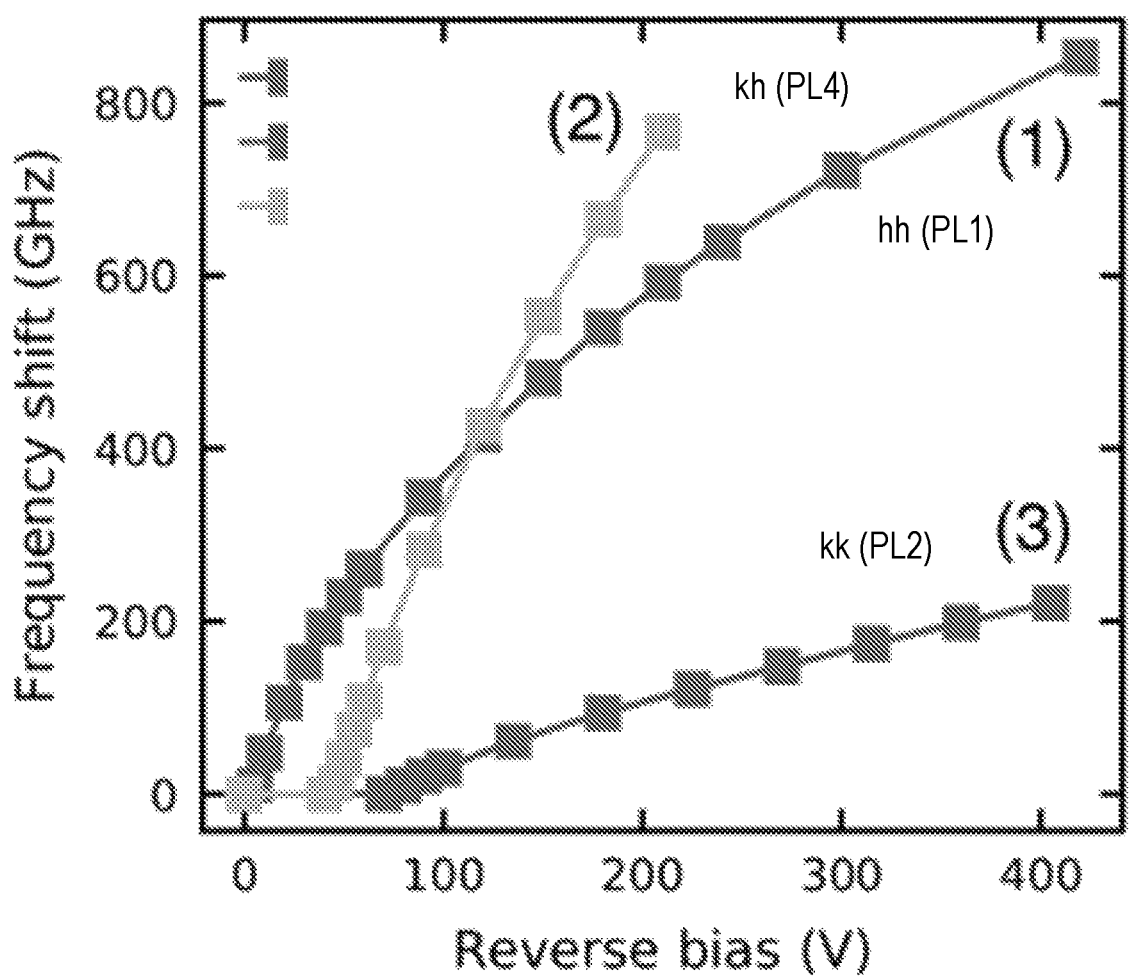
FIG. 25 shows high-field Stark shifts of multiple defects, demonstrating large on-axis shifts with high degrees of conserved symmetry.

Furthermore, since the Stark shift represents the electric field at the defect, very little field is applied to the defect before a certain threshold voltage is achieved where the depletion region reaches the defect, as shown above in FIG. 4. The threshold for Stark shifts corresponds to the same point where significant photo-bleaching occurs (switching region in FIG. 10) when using off resonant excitation. Additionally, a combination of the position of the electrode and the 4 degree off-axis cut of the p-i-n structure leads to application of a slight transverse field to the defects. In some defects, this may accentuate the inherent strain asymmetry, but in other defects it works against the local transverse strain and improves the symmetry of the defect, providing a convenient way to both tune the optical lines and restore symmetry with a single gate, as shown in FIGS. 24 and 25. In particular, FIG. 24 shows low-field Stark tuning of a single PL2 defect (kk divacancy) showing a turn-on behavior for the Stark shift above a bias threshold. FIG. 25 shows high-field Stark shifts of multiple defects, demonstrating large on-axis shifts with high degrees of conserved symmetry. Further, electric gates may be fabricated in multiple dimensions, as shown in FIG. 32 and discussed above, to control the symmetry and tune the Stark shift.

Overall, the implementations above may be used as a widely tunable, narrow source of single photons. High Stark shift to linewidth ratios may be achieved (>40,000). These characteristics also enables tuning of remote defects into resonance and thus producing indistinguishable photons by different quantum emitters. The tunability range provided by the implementations above may be sufficiently wide for enabling tuning of a (hh) divacancy of one defect in resonance with a (kk) divacancy of another defect, allowing for interference and entanglement between different species of defects. Further, the optical structure of these single defects can serve as a nanoscale electric field sensor enabling field mapping in working devices with sensitivities of ~100 V/m/sqrt(Hz) or better.

d. Reducing Spectral Diffusion Using Charge Depletion

As described above, uncontrolled fluctuating electrical and charge environments are a common problem in spin systems where they can cause dephasing, as well as in quantum emitters where they result in spectral diffusion of orbital energies and lead to large inhomogeneous broadening. For example in VV0, a single fluctuating electron charge 100 nm away can cause shifts and broadening on the order of 30 MHz, while natural linewidth for a defect may be as narrow as ~10 MHz. Previous work has shown that by doing an exhaustive search through many defects in a specially grown material, one can find defects with lines as narrow as 80 MHz (typically 100-200 MHz or larger), this is still much larger than the predicted lifetime-limit of 11 MHz. In bulk intrinsic commercial material, the narrowest linewidths are usually around or above 120 MHz.

Figure 26:
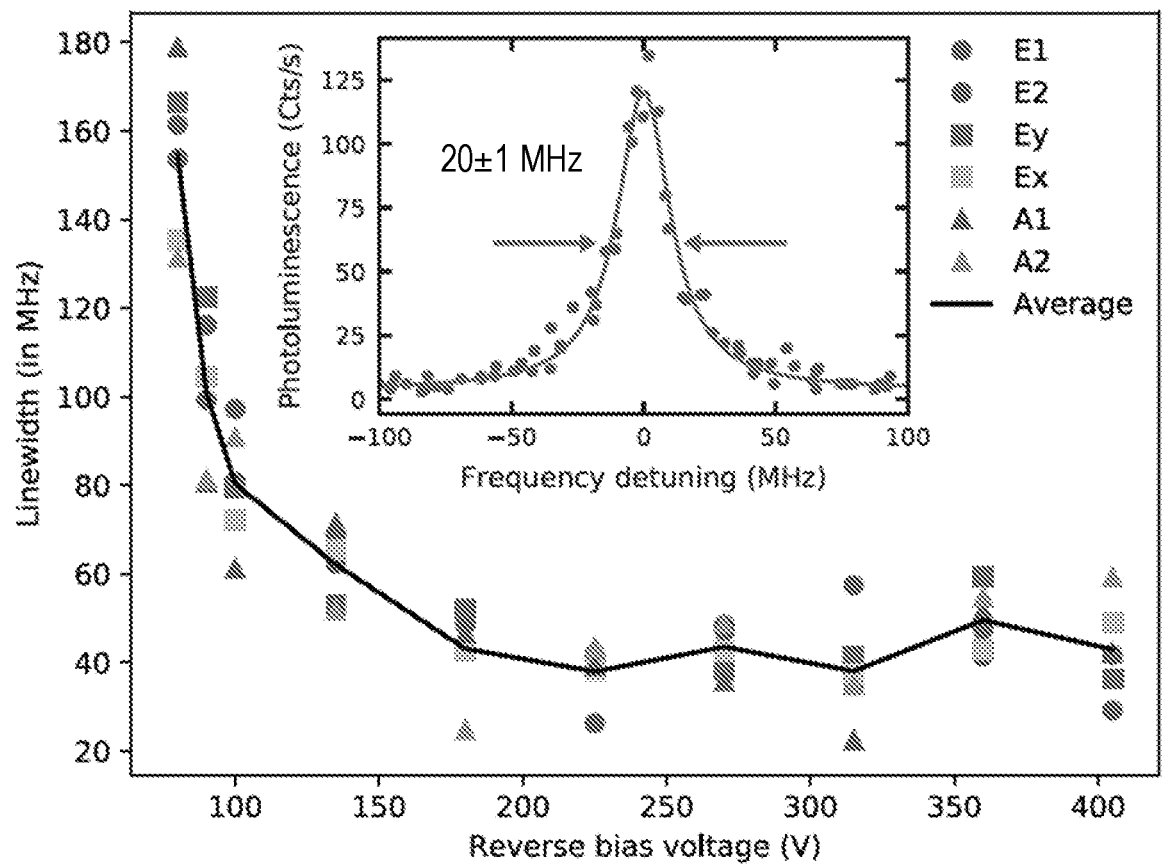
FIG. 26 illustrates example dependence of spectral linewidth of the optical emission for a single defect as a function of the reverse electric bias.
Figure 27:
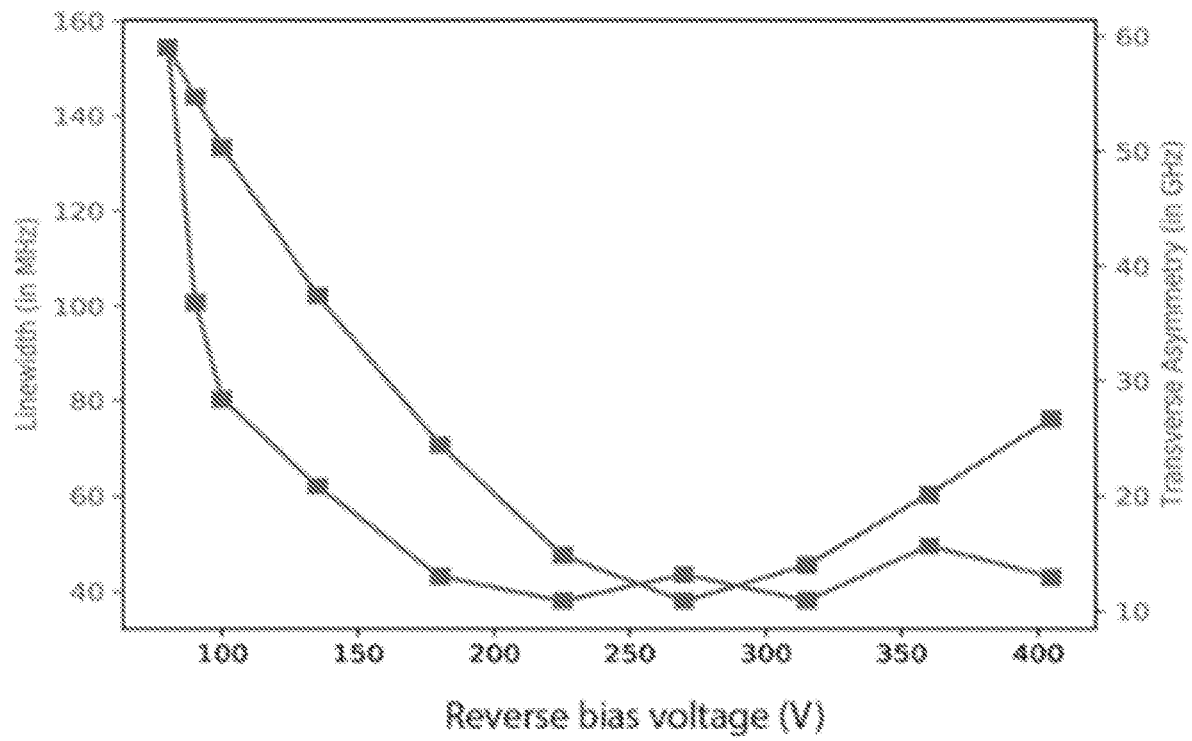
FIG. 27 shows a comparison of linewidth and defect transverse asymmetry combining transverse strain and transverse electric field effects.

The implementations above show that the ionized charge state may be quickly returned to charge neutral state by free carrier recapture by the defect. Free carriers may be available when the p-i-n diode structure is not biased with excessively high reverse bias. Such free carrier recapture may facilitate stabilization of electric charge environment for the defect to some extent. When large reverse electric field is applied, free carriers can be depleted in the charge environment of the defects. Large reverse electric field may provide large Stark shift for achieving wide emission wavelength tunability from the defect. Because free carriers are not available for recapturing by the defect, a charge repumping/resetting optical excitation may be used to combat the effect of photo-ionization. With stabilization of the charge instability caused the photo-ionization (achieved either by free carrier recapturing or optical charge repumping/resetting), linewidths on the order of 20-30 MHz may be achieved by any of the defects without the need for an exhaustive search. A voltage dependence of the photoluminescence excitation spectral linewidth is shown in FIG. 26. A model illustrate such a mechanism is given in FIGS. 5a-5b. As shown in FIG. 26, the linewidth reduction as a function bias is consistent for all observed defect species. This reduction in PLE linewidth has a different voltage dependence than the transverse asymmetry in the defect, as shown in FIG. 27, thus eliminating reduced mixing as a possible mechanism for linewidth narrowing.

Figure 31:
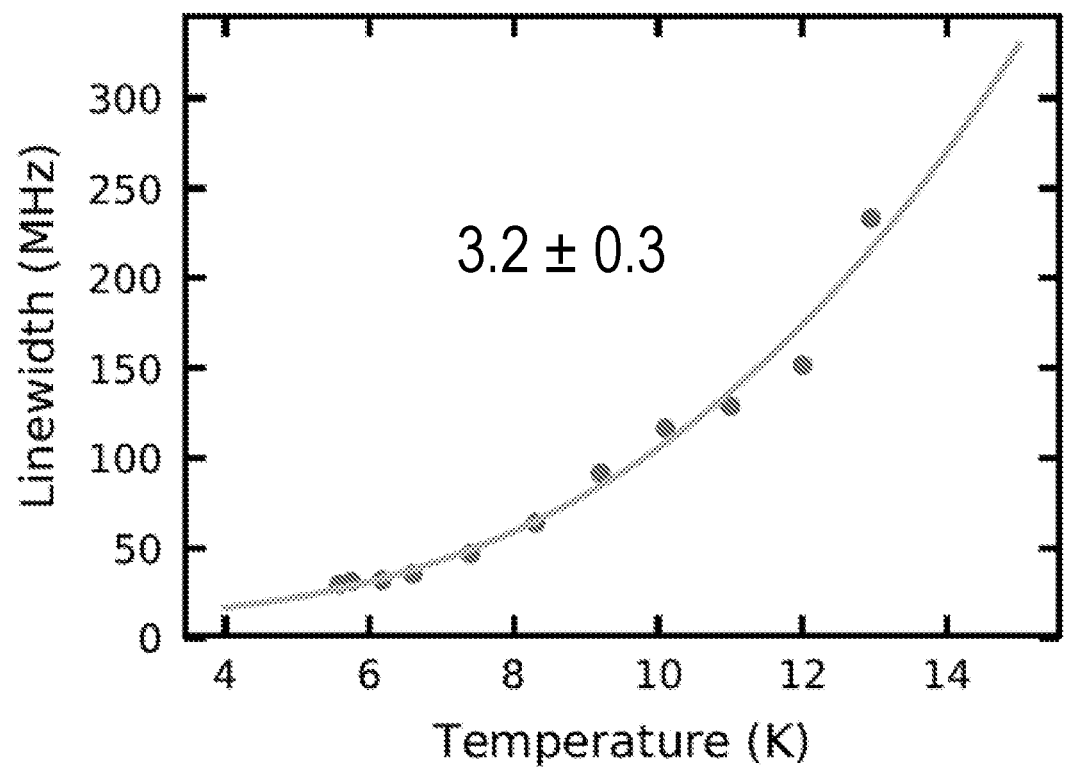
FIG. 31 illustrates a temperature dependence of an emission linewidth of a defect.

The temperature dependence of the linewidth as can be seen in FIG. 31 is roughly consistent with a $T^3$ scaling at these low temperatures (fitted exponent 3.2±0.3), where at higher temperatures >15K a $T^5$ dependence has been reported[4] (SI). From the fit, a zero temperature linewidth of 14±5 MHz can be extracted. Our results are therefore consistent with a lifetime limited line that is broadened by temperature. With lower temperatures, even narrower lines may be possible. The remaining broadening at high reverse bias may be from charge instability arising from processes other than the undepleted free carriers. The narrowest single scan linewidth observed is around 21 MHz.

e. Quantum Information Manipulation and Other Functions

The defects states above further provides ground or excited level spin states having long coherence time. The implementations above using reverse bias to deplete free carriers to control charge state in the defect may further enhance the coherence time of the spin states and increase storage time when these defect states are used as quantum memories. These spin states may be manipulated using optical and microwave fields to achieve quantum information preparation, initialization, operation, and read out. Additionally, the defect states may also be used for sensing. For example, the Stark shift effect may be used as the underlying basis for an electric field sensor in a semiconductor device. Use of the systems described above is also contemplated for other sensing applications, such as magnetic field sensor, temperature sensor and the like.

A method for electrical readout of the spin state of defects can be implemented using doped semiconductor structures (homostructures or heterostructures) as described above. Doped semiconductor structures can be fabricated to form an avalanche photodiode (APD) with high quantum efficiency. These APDs can have integrated single spin defects inside, for example embedded within the intrinsic region of a p-i-n structure. Using spin-to-charge conversion protocols, the spin state of the defect can be mapped onto an ionization event in the APD, producing a single electron or hole. This single charge in an operating APD will cause an avalanche, creating a large current spike allowing for single charge detection, similar to a conventional APD which can sense single electron-hole pairs formed by illumination with a single photon. Implementation of such an electrical readout method allows the APD with embedded defects to be used as an in-situ detector for the quantum state, without the need for other collection optics and superconducting detectors.

Spin to charge conversion can be achieved through spin selective photoionization in multiple ways. As one example, spin to charge conversion can be achieved through the spin selective shelving of the intersystem crossing of a defect, with the ionization rate changing as a function of the spin state.

As another example, spin to charge conversion can be achieved by using spin-selective resonant excitation, where excitation and ionization can only occur if the defect is in a particular quantum state. In this electrical readout scheme, after spin-to-charge conversion, the spin state of the defect can be optically readout with high fidelity due to differences in fluorescence between the charge states of the defect. This scheme of electrical readout can be generalized to ensembles, and can be used for a wide variety of defects that can be isolated in APD structures.

Embodiments of the invention and the various features and advantageous details thereof are explained more fully with reference to the non-limiting embodiments that are illustrated in the accompanying drawings and detailed in the following description. Descriptions of well-known starting materials, processing techniques, measurements techniques, components and equipment are omitted, so as not to unnecessarily obscure the embodiments of the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to one of ordinary skill in the art from this disclosure.

As such, the electrometry implementations disclosed above and based on electric field dependent charge state conversion in semiconductors may be used to detect various characteristics of an environmental electric field, in a wide spectral range (e.g., radio wave and microwave frequencies). Such electrometry systems may be used to detect the presence of environmental electrical field in a binary manner. In addition, various characteristics of the environmental electric filed may be detected (e.g., magnitude and spectral frequency).

While the particular invention has been described with reference to illustrative embodiments, this description is not meant to be limiting. Various modifications of the illustrative embodiments and additional embodiments of the disclosure, will be apparent to one of ordinary skill in the art from this description. Those skilled in the art will readily recognize that these and various other modifications can be made to the example embodiments, illustrated and described herein, without departing from the spirit and scope of the present invention. It is therefore contemplated that the appended claims will cover any such modifications and alternate embodiments. Certain proportions within the illustrations may be exaggerated, while other proportions may be minimized. Accordingly, the disclosure and the figures are to be regarded as illustrative rather than restrictive.

The invention claimed is:

1. An optical source device, comprising:
   a first layer of a first semiconductor;
   a second layer of a second semiconductor;
   a third layer of a third semiconductor located between the first and second layers, the third layer comprising a defect addressable by optical means;
   a first terminal in electric contact with the first layer; and
   a second terminal in electric contract with the second layer,
   wherein:
      the defect comprises an optically bright excited state for generating an optical emission;
      the first and second terminals are configured to apply an electric bias across the third layer;
      the optical source device is adapted to receive a first optical excitation for preparing the defect into the optically bright excited state for generating the optical emission; and
      the electric bias is configured to control a timing, an emission spectral linewidth, or a wavelength of the optical emission from the defect.

2. The optical source device of claim 1, wherein the first layer is of p type and the second layer is of n type and wherein the electric bias is configured to control the timing of the optical emission from the defect by:
   enabling the optical emission when the electric bias is lower than a first threshold bias value; and
   quenching the optical emission when the electric bias is higher than a second threshold bias value.

3. The optical source device of claim 2, where the electric bias is configured for reverse bias of p-i-n junction of the optical source device.

4. The optical source device of claim 2, wherein the electric bias is controlled to alternate between a first bias lower than the first threshold bias value and a second bias higher than the second threshold bias value.

5. The optical source device of claim 2, wherein the first threshold bias value is identical to or lower than the second threshold bias value.

6. The optical source device of claim 2, wherein:
   the first threshold bias value is configured such that charges in the third layer is above a first predetermined charge concentration threshold level when the electric bias is below the first threshold bias value; and
   the second threshold bias value is configured such that the charges in the third layer is depleted to below a second predetermined charge concentration threshold level when the electric bias is above the second threshold bias value.

7. The optical source device of claim 6, wherein the optical emission is quenched when the electric bias is higher than the second threshold bias value due to photo-ionization of the defect into an optically inactive state and a lack of free carriers for returning the defect from the optically inactive state to an optically active state via free carrier recapturing by the defect.

8. The optical source device of claim 7, wherein the optically inactive state comprises a charge state and an electric charge level instability in the defect due to the photo-ionization is stabilized via recapturing of the free carriers in the third layer by the defect when the electric bias is below the first threshold bias value.

9. The optical source device of claim 2, wherein the electric bias is configured to control the emission spectral linewidth of the optical emission from the defect by reducing a spectral diffusion of the optical emission when the electric bias is below the first threshold bias value.

10. An optical source device, comprising:
a first layer of a first semiconductor;
a second layer of a second semiconductor;
a third layer of a third semiconductor located between the first and second layers, the third layer comprising a defect addressable by optical means;
a first terminal in electric contact with the first layer; and
a second terminal in electric contract with the second layer,
wherein:
  the defect comprises an optically bright excited state for generating an optical emission;
  the first and second terminals are configured to apply an electric bias across the third layer;
  the optical source device is adapted to receive a first optical excitation for preparing the defect into the optically bright excited state for generating the optical emission;
  the electric bias is configured to control a timing, an emission spectral linewidth, or a wavelength of the optical emission from the defect; and
  wherein the electric bias is reverse bias across a p-i-n junction of the optical source device and is larger than a threshold bias value above which charges in the third layer are depleted and is configured to achieve a large Stark shift in the defect for providing a wavelength tunability and to reduce spectral diffusion of the optical emission.

11. The optical source device of claim 10, further adapted to receive a second optical excitation for charge repumping of the defect and configured to increase emission efficiency of the defect and for further controlling the emission spectral linewidth via the charge repumping of the defect.

12. The optical source device of claim 11, wherein the first optical excitation causes photo-ionization of the defect into an optically inactive state and the second optical excitation is configured to repump the defect from the optically inactive state to optically active state when the electric bias larger than the threshold bias value is applied.

13. The optical source device of claim 12, wherein the optically inactive state comprises a charge state and the second optical excitation, in addition to the electric bias, is configured to further stabilize a charge level in the defect.

14. The optical source device of claim 12, wherein the second optical excitation is configured to further reduce spectral diffusion or blinking of the optical emission by reducing charge instability due to the photo-ionization from the first optical excitation in the defect by stabilizing a charge level in the defect, and wherein wavelength of the second optical excitation is selected such that an amount of photo-ionization of the defect by the second optical excitation is below a predetermined threshold.

15. The optical source device of claim 11, wherein the second optical excitation is non-resonant with the optically bright excited state of the defect.

16. An optical source device, comprising
a first layer of a first semiconductor;
a second layer of a second semiconductor;
a third layer of a third semiconductor located between the first and second layers, the third layer comprising a defect addressable by optical means;
a first terminal in electric contact with the first layer; and
a second terminal in electric contract with the second layer,
wherein:
  the defect comprises an optically bright excited state for generating an optical emission;
  the first and second terminals are configured to apply an electric bias across the third layer;
  the optical source device is adapted to receive a first optical excitation for preparing the defect into the optically bright excited state for generating the optical emission;
  the electric bias is configured to control a timing, an emission spectral linewidth, or a wavelength of the optical emission from the defect; and
  wherein the third layer comprises another defect and wherein the optical source device is configured to align the optical emission of the defect and optical emission from the another defect into resonance.

* * * * *